United States Patent
Paek et al.

(10) Patent No.: US 11,877,503 B2
(45) Date of Patent: Jan. 16, 2024

(54) MOTHER SUBSTRATE AND DISPLAY PANEL HAVING SUBSTRATE WITH OPENING, AND METHOD OF MANUFACTURING THE DISPLAY PANEL

(71) Applicant: LG Display Co., Ltd., Seoul (KR)

(72) Inventors: Seung Han Paek, Paju-si (KR); Hyun Jin An, Paju-si (KR); Kyung Jae Yoon, Paju-si (KR); Jeon Phill Han, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 264 days.

(21) Appl. No.: 17/395,173

(22) Filed: Aug. 5, 2021

(65) Prior Publication Data
US 2022/0045288 A1    Feb. 10, 2022

(30) Foreign Application Priority Data

Aug. 6, 2020  (KR) .................. 10-2020-0098268
Jun. 24, 2021  (KR) .................. 10-2021-0082029

(51) Int. Cl.
*H10K 77/10*      (2023.01)
*H10K 50/86*      (2023.01)
*H10K 50/844*     (2023.01)
*H10K 71/00*      (2023.01)
*H10K 102/00*     (2023.01)

(52) U.S. Cl.
CPC ........ *H10K 77/111* (2023.02); *H10K 50/844* (2023.02); *H10K 50/86* (2023.02); *H10K 71/00* (2023.02); *H10K 71/851* (2023.02); *H10K 2102/311* (2023.02)

(58) Field of Classification Search
CPC .... H10K 77/111; H10K 50/844; H10K 50/86; H10K 71/00; H10K 71/851; H10K 2102/311; H10K 2102/3026; H10K 77/10; H10K 59/12; H10K 59/1201; Y02E 10/549; G09F 9/301
See application file for complete search history.

(56) References Cited

U.S. PATENT DOCUMENTS

| | | | | |
|---|---|---|---|---|
| 2008/0220151 A1* | 9/2008 | Kataoka | ................. | H10K 71/00 427/66 |
| 2019/0339741 A1* | 11/2019 | Park | ..................... | H10K 59/122 |
| 2020/0403189 A1* | 12/2020 | Lee | ........................ | H10K 71/00 |
| 2021/0167338 A1* | 6/2021 | Tanaka | ..................... | G09F 9/00 |

* cited by examiner

*Primary Examiner* — J. E. Schoenholtz
(74) *Attorney, Agent, or Firm* — Birch, Stewart, Kolasch & Birch, LLP

(57) ABSTRACT

Provided is a mother substrate comprising a glass substrate including a plurality of cutting lines, an organic film overlapping the plurality of cutting lines on the glass substrate, and a plurality of cells spaced apart from each other with each of the plurality of cutting lines therebetween on the glass substrate.

20 Claims, 31 Drawing Sheets

MOTHER SUBSTRATE AND DISPLAY PANEL HAVING SUBSTRATE WITH OPENING, AND METHOD OF MANUFACTURING THE DISPLAY PANEL

CROSS-REFERENCE TO RELATED APPLICATIONS

This application claims the benefit of priority under 35 U.S.C. § 119(a) to Korean Patent Application No. 10-2020-0098268 filed on Aug. 6, 2020 in the Republic of Korea, and Korean Patent Application No. 10-2021-0082029 filed on Jun. 24, 2021 in the Republic of Korea, the entire contents of all these applications being expressly incorporated herein by reference into the present application.

BACKGROUND

1. Field

The present disclosure relates to a mother substrate, a display panel, and a method of manufacturing the same.

2. Discussion of Related Art

An electroluminescent display device is classified into an inorganic light emitting display device and an organic light emitting display device depending on the material of a light emitting layer. The organic light emitting display device of an active matrix type includes an Organic Light Emitting Diode (hereinafter referred to as "OLED") that emits light by itself, and has an advantage that the response speed is fast, and the luminous efficiency, luminous and viewing angle are large.

In the organic light emitting display device, an OLED is formed on each of the pixels. The organic light emitting display device has a high response speed, excellent luminous efficiency, luminous, viewing angle, and the like, and is capable of expressing black gradation in complete black, thereby providing excellent contrast ratio and color reproduction.

The organic light emitting display device does not require a backlight unit, and can be implemented on a plastic substrate, which is a flexible material, a thin glass substrate, or a metal substrate. Therefore, a flexible display can be implemented as the organic light emitting display device.

In the case of a flexible display, the size of the screen can be varied by winding, folding, and bending a flexible panel. The flexible display can be implemented as a rollable display, a foldable display, a bendable display, a slidable display, or the like. Such flexible displays can be applied to not only mobile devices such as smartphones and tablet PCs, but also to TVs, vehicle displays, and wearable devices, and their application fields are expanding.

The flexible display can implement a Bezel bended display in which a bezel region is minimized by folding a non-display region using a flexible panel structure. In addition, the flexible display can be coupled to the information device in a structure capable of varying the size of the screen. Since the information device employs a flexible display to increase the size of the screen, a multi-tasking is possible by executing two or more applications or contents.

SUMMARY OF THE INVENTION

The flexible substrate used in a flexible display can be made of a flexible material, for example, a polyimide (PI) film substrate. In a manufacturing process of a flexible display panel, a circuit layer, an emitting element and the like can be formed on the PI film in a state where a carrier substrate having high rigidity and heat resistance is bonded under the PI film substrate. Since the carrier substrate is only needed in the manufacturing process, after all the layers necessary for driving the pixels are formed on the PI film, the carrier substrate can be separated from the PI film substrate The carrier substrate and the PI film substrate can be separated by a laser lift off process using a laser equipment.

In the manufacturing process of the flexible display panel, the manufacturing cost can be rather high due to expensive laser equipment, and defects may occur during subsequent processing due to foreign matters and roughness of the surface of the PI film when the PI film substrate is peeled off by irradiating a laser on the entire surface of the substrate.

In addition, a folding part can be configured using an organic material so that the existing flexible display panel is flexibly bent. In this case, the stiffness of the folding portion can be weak, such that crease or hinge stains can be seen.

An object of the present disclosure is to address the aforementioned needs and/or other limitations associated with the related art.

In a mother substrate according to an embodiment of the disclosure, the mother substrate comprises a glass substrate including a plurality of cutting lines; an organic film overlapping the plurality of cutting lines on the glass substrate; and a plurality of cells spaced apart from each other with each of the plurality of cutting lines therebetween on the glass substrate.

The organic film can overlap the plurality of cells and the plurality of cutting lines.

The glass substrate can further include at least one bending line disposed on each of the plurality of cells. The organic film can include a first organic film disposed on the glass substrate to overlap a cutting line between neighbored cells of the plurality of cells, and a second organic film disposed on the glass substrate to overlap the at least one bending line.

Each of the cells can comprise a circuit layer disposed on the glass substrate to drive a pixel; a light emitting element layer including a first electrode on the circuit layer, a bank disposed on the first electrode to define a light emitting area, an organic compound layer on the first electrode in the light emitting area, and a second electrode on the organic compound layer; an encapsulation layer covering the light emitting element layer; and a polarizing plate disposed on the encapsulation layer. The organic film light can be disposed between the glass substrate and the circuit layer, and the organic layer and the bank include a same material.

The organic film and the polarizing plate can be sequentially stacked on the glass substrate between adjacent cells to overlap the plurality of cutting lines.

The first and second organic films can include a polyimide film.

The glass substrate can include a first opening exposing the first organic layer at positions overlapping the plurality of cutting lines; a second openings exposing the second organic layer at positions overlapping the at least one bending line, and a coating layer is disposed on a rear surface of the glass substrate and at least a portion of the first and second openings.

In a display panel according to an embodiment of the disclosure, the display panel comprises a glass substrate; a circuit layer disposed on the glass substrate to drive a pixel; a light emitting element layer including a light emitting element which includes a first electrode on the circuit layer, an organic compound layer on the first electrode, and a second electrode on the organic compound layer; an encapsulation layer covering the circuit layer and the light emitting element layer; a polarizing plate on the encapsulation layer; and an organic film on the glass substrate.

The display panel can comprise a bank disposed on the first electrode to define a light emitting area, wherein the organic film and the bank include a same material.

The display panel can comprise at least one bending line for folding the display panel. The organic film can include a first organic film on edges of the glass substrate, and a second organic film disposed on the glass substrate to overlap the at least one bending line.

The glass substrate can include an opening exposing the second organic layer at a position overlapping the at least one bending line.

A coating layer can be disposed on a rear surface of the glass substrate and at least a portion of the opening.

An edge sidewall of the glass substrate can include a wedge-shaped tapered surface, and a thickness of the sidewall becomes thinner as it goes to the end of the sidewall.

The wedge-shaped tapered surface can protrude out of the circuit layer.

A length of the wedge-shaped tapered surface can be inversely proportional to a thickness of the glass substrate.

In a method of manufacturing a display panel from a plurality of cells disposed on a mother glass substrate having an organic film according to an embodiment of the disclosure, the method comprises setting a cutting line between adjacent cells of the plurality of cells; forming a mask on one surface of the mother glass substrate to cover regions other than the cutting line; etching the mother glass substrate exposed through the mask to form a first opening in the mother glass substrate; removing the mask; and cutting the organic film by irradiation laser to the organic film overlapping the cutting line to separate the plurality of cells.

The setting the cutting line can include setting at least one bending line on which the display panel is folded in each of the plurality of cells. The forming a mask ma include forming the mask so that the mask does not cover the at least one bending line; and etching the mother glass substrate exposed through the mask to form a second opening.

The organic film can include a first organic film disposed on the glass substrate to overlap a cutting line between neighbored cells of the plurality of cells; and a second organic film disposed on the mother glass substrate to overlap the at least one bending line.

The method can further comprise forming a coating layer on another surface of the mother glass substrate after removing the mask; and cutting the coating layer by irradiating the laser to the coating layer when the organic film is cut.

The etching the mother glass substrate can be implemented by a wet etching.

According to the embodiment, when the display panel is separated from the mother substrate, since a laser lift off process is not used, it is possible to prevent defects due to foreign matters generated when peeling the PI film substrate and the roughness of the PI film surface, and reduce the cost.

According to the embodiment, since the display panel can be fabricated based on a glass substrate, it is possible to prevent the occurrence of the hinge stains of the folding region and enhance durability.

Furthermore, since the edge of the glass substrate can be fabricated in a wedge type, it is possible to prevent damage to the substrate.

The effects of the present disclosure are not limited to the above-mentioned effects, and other effects that are not mentioned will be clearly understood by those skilled in the art from the description of the claims.

BRIEF DESCRIPTION OF THE DRAWINGS

The above and other objects, features, and advantages of the present disclosure will become more apparent to those of ordinary skill in the art by describing exemplary embodiments thereof in detail with reference to the attached drawings, in which.

DETAILED DESCRIPTION OF THE EMBODIMENTS

Figure 1:
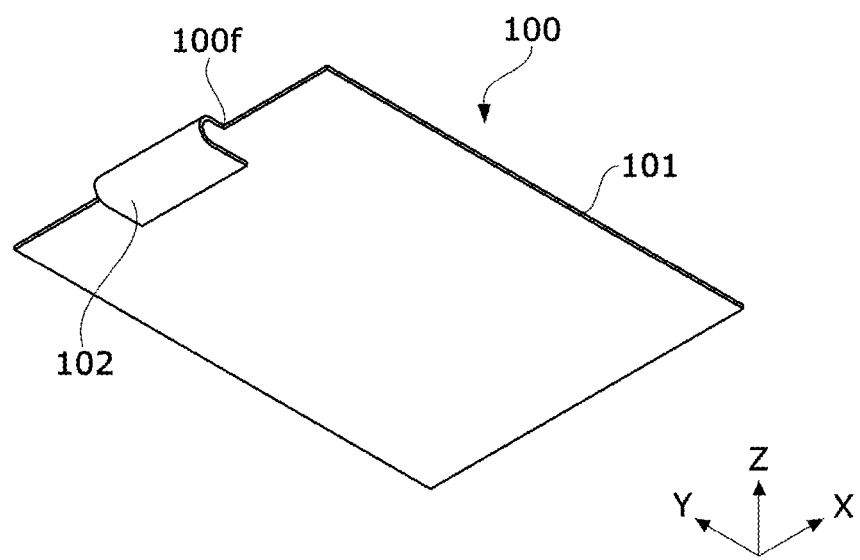
FIGS. 1 to 3 are views showing display panels including a bending portion according to examples of the present disclosure.
Figure 1:
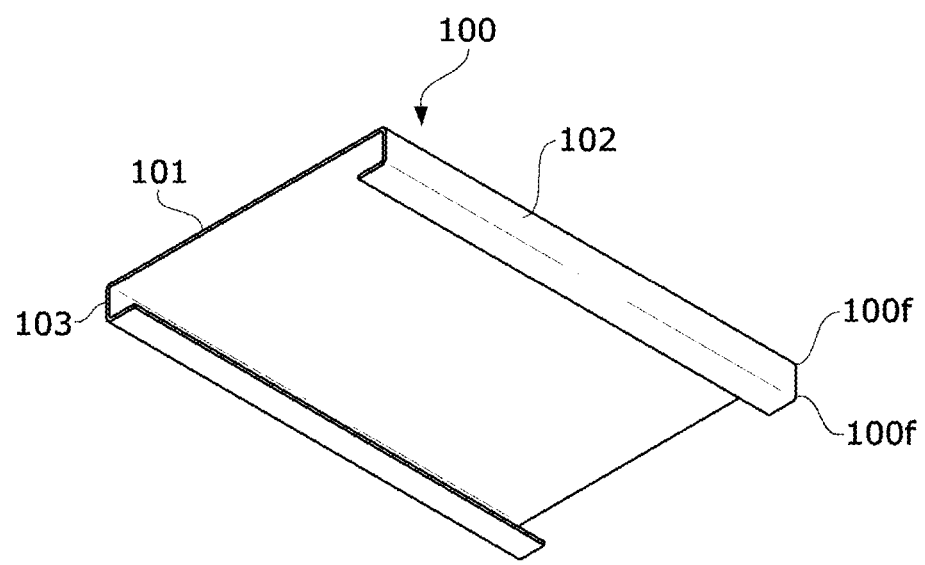

The advantages and features of the present disclosure, and how to accomplish them, will become apparent with reference to the embodiments described in detail below together with the accompanying drawings. However, the present disclosure is not limited to embodiments disclosed below, and can be implemented in various forms. These embodiments are provided so that the present disclosure will be exhaustively and completely described, and will fully convey the scope of the present disclosure to those skilled in the art to which the present disclosure pertains. The present disclosure is only defined by the scope of the claims.

Shapes, sizes, ratios, angles, number, and the like illustrated in the drawings for describing embodiments of the present disclosure are merely exemplary, and the present disclosure is not limited thereto. Like reference numerals designate like elements throughout. In the following description, when a detailed description of well-known functions or configurations related to this document is determined to unnecessarily cloud a gist of the disclosure, the detailed description thereof will be omitted or may be provided briefly.

In the present disclosure, when the terms "include", "have", "comprised of", etc. are used, other components can be added unless "—only" is used. A singular expression can include a plural expression as long as it does not have an apparently different meaning in context.

In the explanation of components, even if there is no separate description, it is interpreted as including an error range.

In the description of position relationship, when a structure is described as being positioned "on or above", "under or below", "next to" another structure, this description should be construed as including a case in which the structures contact each other as well as a case in which a third structure is disposed therebetween.

The terms "first", "second", etc. can be used to describe various components, but the components are not limited by such terms. The terms are used only for the purpose of distinguishing one component from other components, and may not define order. For example, a first component can be designated as a second component without departing from the scope of the present disclosure.

The features of various embodiments of the present disclosure can be partially combined or entirely combined with each other, and can be technically interlocking-driven in various ways. The embodiments can be independently implemented, or can be implemented in conjunction with each other.

Hereinafter, a "bending part" refers to a part that is bent in a display panel. The bending part can be a configuration that is bent in, for example, a flexible display panel, can be a configuration that is bent to place a drive integrated circuit (IC) on a rear surface of a display device, or can be a configuration that is bent to implement a multi-display. The bending part is not limited to these configurations Hereinafter, various embodiments will be described in detail with reference to the accompanying drawings. All the components of each display device and each display panel according to all embodiments of the present disclosure are operatively coupled and configured.

In the embodiment, the display panel is fabricated based on a bendable glass film substrate. The glass film substrate can be a glass film having a thickness of 0.2 mm or less. The glass film can be used as a commercially available reinforced glass film. Hereinafter, the glass substrate can be interpreted as a glass film substrate.

As shown in FIG. 1, for example, a display panel 100 has a width in the X-axis direction, a length in the Y-axis direction, and a constant thickness in the Z-axis direction. The thickness of the display panel 100 is thicker than that of the glass substrate because a circuit layer and a light emitting element layer can be disposed on the glass substrate. The width and length of the display panel 100 can be set to various design values according to the application field of the display device. The display panel 100 can be fabricated in the shape of a substantial rectangular plate as shown in FIG. 1, but is not limited thereto. For example, the display panel 100 can be fabricated as a panel having a different shape including a curved portion.

The display panel 100 can include non-bending portions 101 and 102 and a bending portion 100*f* disposed therebetween. The bending portion 100*f* can be formed as a bending line that crosses from one end to the other end of the display panel along the length direction Y or the width direction X. The display panel 100 can be bent or folded around the bending portion 100*f* by an external force. When the thickness of the glass substrate of the display panel 100 is thin, the display panel can be flexibly bent with a sufficiently large curvature even by a small force.

The glass substrate of the bending portion 100*f* can have a thickness smaller than that of the glass substrate of the non-bending portions 101 and 102. Accordingly, the rigidity of the folding portion 100*f* can be improved, and a difference in refractive index between the bending portion 100*f* and the non-bending portions 101 and 102 can be reduced.

In the embodiment, an organic film including an organic material can be added to at least a part of the bending portion 100*f* so that the display panel 100 can be easily bent in the bending portion 100*f*. As the organic material, a resin material having good elasticity, for example, one or a mixture of two or more of polyimide, polyurethane, acrylic, and silicone synthetic rubber can be applied. As an example of silicone synthetic rubber, a polydimethylsiloxane (PDMS) can be used.

The display panel 100 can include the bending portion 100*f* and the non-bending portions 101 and 102. At least one of the non-bending portions 101 and 102 can include a display region in which an input image is reproduced. The non-bending portions 101 and 102 can have different sizes.

Referring to FIG. 1, the non-bending portions 101 and 102 can include a first region 101 and a second region 102. In one embodiment, the first region 101 can include a pixel array in which an image is displayed, and the second region 102 can include an IC mounting region in which a drive integrated circuit (IC) for driving pixels is mounted. In another embodiment, the first region 101 can include a pixel array in which an image is displayed, and the second region 102 can include a pixel array in which at least a part of the image or preset additional information is displayed.

When the second region 102 is used as an IC mounting region, the second region 102 can be bent at a high curvature in the bending portion 100f, such that the second region 102 can be folded to a surface opposite to the display surface on which the image is displayed. For example, the second region 102 can be folded behind the display surface of the first region 101. In other words, the second region 102 can be bent around the bending portion 100f to form 180 degrees with the first region 101.

Figure 2:
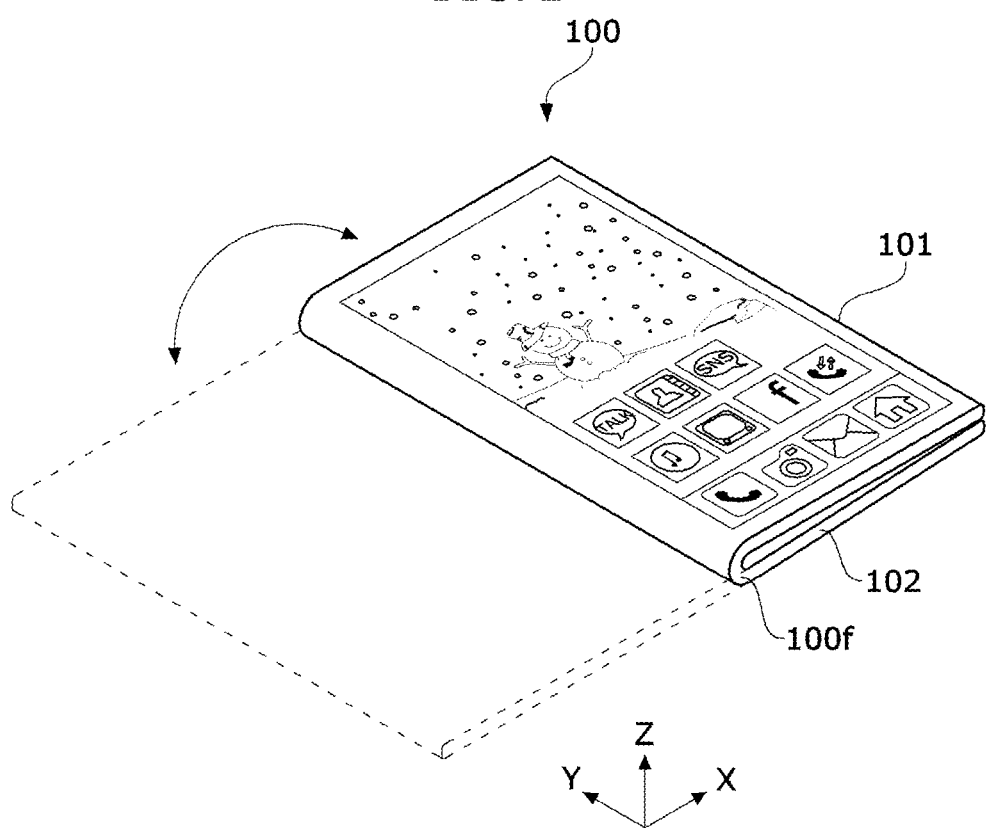
Figure 3:
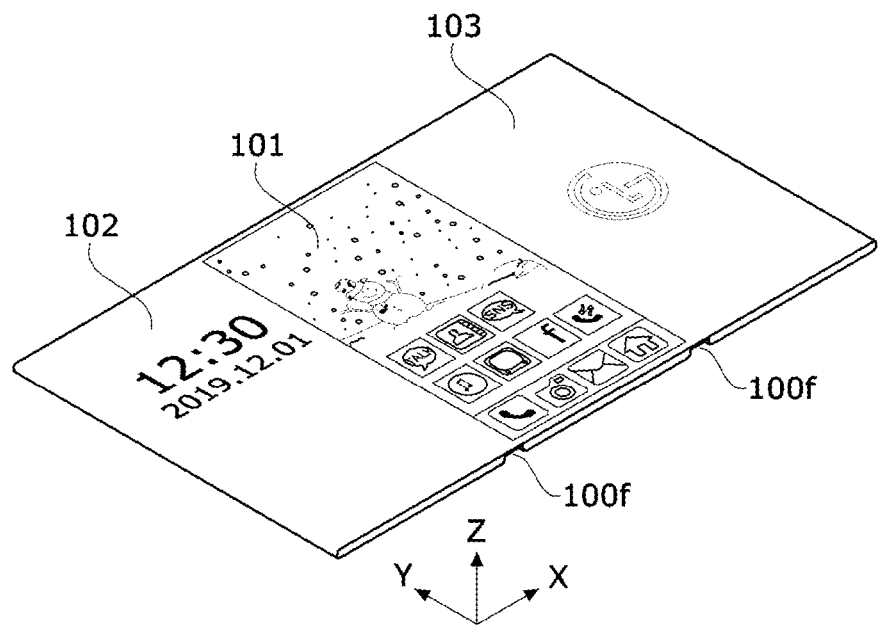
Figure 3:
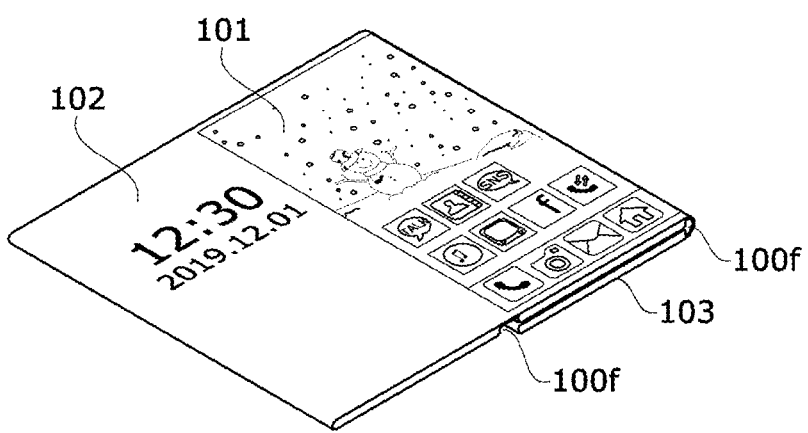
Figure 3:
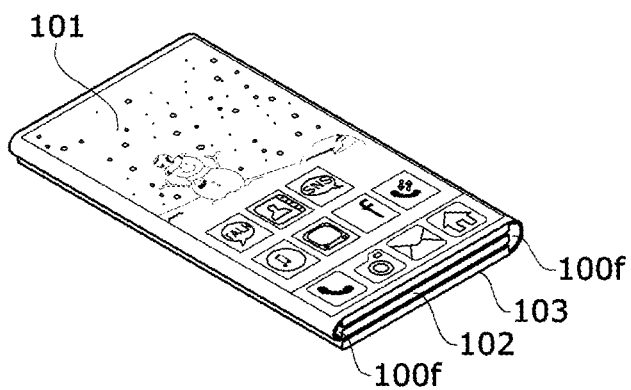

The examples of FIGS. 2 and 3 show bending portions 100f disposed between three non-bending portions 101, 102, and 103 in a foldable display. Each of the non-bending portions 101, 102, and 103 includes a pixel array on which an image or information is displayed. The bending portions 100f can include glass and an organic film as described above.

Figure 4:
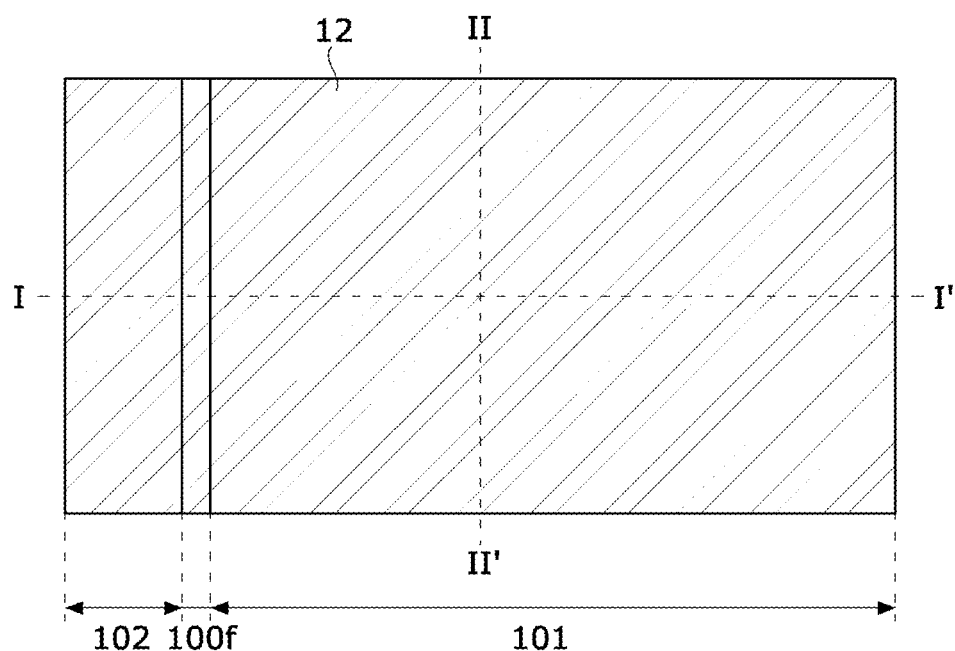
FIG. 4 is a plan view of a display panel according to an embodiment of the present disclosure.

FIG. 4 is a plan view of a display panel according to a first embodiment of the present disclosure.

FIGS. 5A to 5D are cross-sectional views taken along line I-I' in FIG. 4.

Figure 5A:
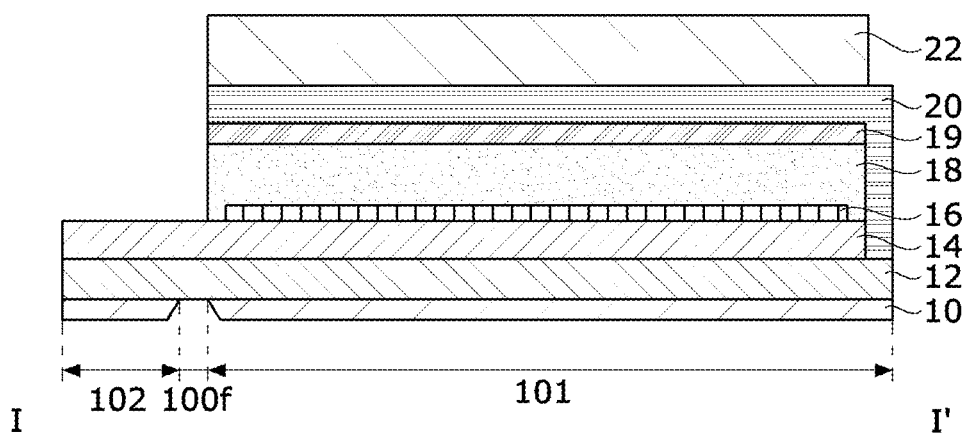
FIGS. 5A to 5D are cross-sectional views taken along line I-I' in FIG. 4.
Figure 5B:
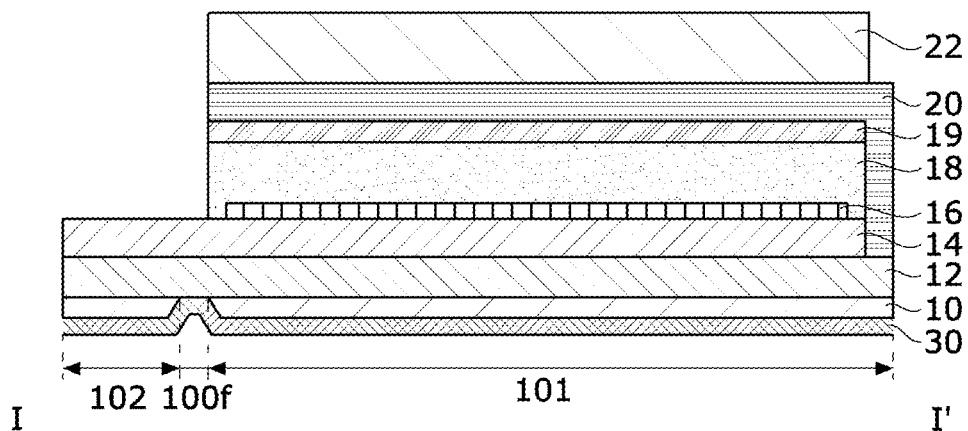
Figure 5C:
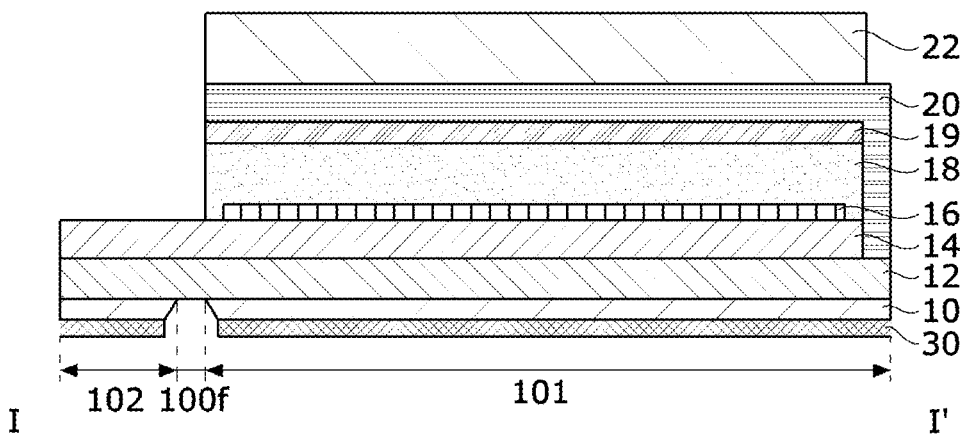
Figure 6A:
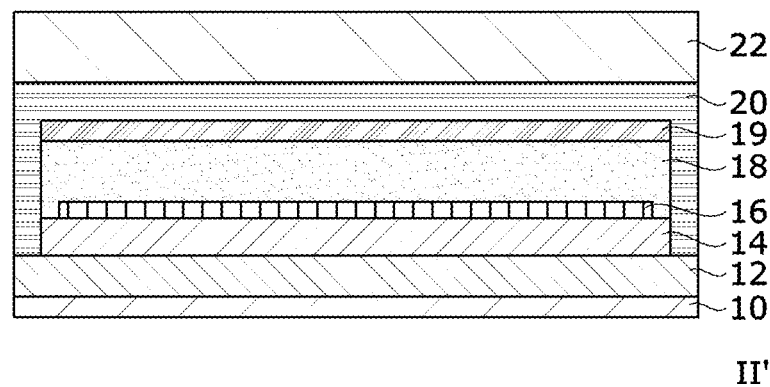
FIGS. 6A and 6B are cross-sectional views taken along line II-II' in FIG. 4.
Figure 6B:
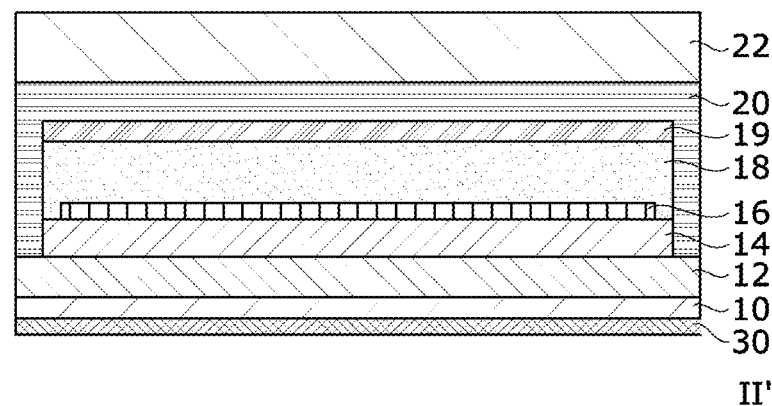

FIGS. 6A and 6B are cross-sectional view taken along line II-II' in FIG. 4. FIG. 6A is a cross-sectional view corresponding to FIG. 5A, and FIG. 6B is a cross-sectional view corresponding to FIGS. 5B to 5C.

Referring to FIG. 4, the display panel 100 according to the first embodiment can include a bending portion 100f and non-bending portions 101 and 102. The non-bending portions 101 and 102 can include a first region 101 and a second region 102. The first region 101 can be a display region. The second region 102 can be an IC region in which a drive IC for driving the first region 101 is disposed. However, the present disclosure is not limited thereto, and as described above, the second region 102 can be a sub-display region. The bending portion 100f can form a bending line extending in one direction when viewed in a plan view. The first region 101 and the second region can be bent at a predetermined angle around the bending line.

Hereinafter, a stacked structure of the display panel 100 according to the first embodiment will be described in detail with reference to FIGS. 5 A to 5D, 6A and 6B.

Referring to FIGS. 5A and 6A, the display panel 100 includes a glass substrate 10, an organic film 12 disposed on the glass substrate 10, a circuit layer 14 sequentially stacked on the organic film 12, and a light emitting element layer 16. The display panel 100 can further include an encapsulation layer 18 covering the circuit layer 14 and the light emitting element layer 16, a polarizing plate 20 attached to the encapsulation layer 18 the by an adhesive agent 19, and a cover window 22 on a polarizing plate 20. A touch screen in which touch sensors are arranged can be implemented on the display panel 100. For example, the touch sensors can be disposed between the encapsulation layer 18 and the polarizing plate 20.

The organic film 12 can be a film including one selected from the group consisting of a polyimide polymer, a polyester polymer, a silicone polymer, an acrylic polymer, a polyolefin polymer, and a copolymer thereof. Since the polyimide has acid resistance and heat resistance, it can be applied to a high temperature process of forming the circuit layer 14 and the light emitting element layer 16. Since the circuit layer 14 can be directly formed on the glass substrate 10 as in the embodiment to be described later, the organic film 120 can be omitted.

The circuit layer 14 can include data lines, a pixel circuit connected to the gate lines and power supply lines, a gate driver connected to the gate lines, and the like. The pixel circuit and the gate driver can include circuit elements such as a thin film transistor (TFT), a capacitor, and the like. In order to reduce the tensile force and stress applied to the circuit layer 14 when the bending portion 100f is bent, the circuit layer 14 can include only wirings of the data lines, the gate lines, and the power supply lines in the bending portion 100f.

The light emitting element layer 16 can include an OLED driven by a driving element of a pixel circuit. The OLED include an organic compound layer formed between an anode and a cathode. The organic compound layer can include a hole injection layer (HIL), a hole transport layer (HTL), an emission layer (EML), an electron transport layer (ETL), and an electron injection layer (EIL), but is not limited thereto. When a voltage is applied to the anode and cathode of the OLED, holes passing through the hole transport layer (HTL) and electrons passing through the electron transport layer (ETL) move to the emission layer (EML) to form excitons, and as a result, the visible light is emitted from the emission layer (EML). The light emitting element layer 16 can further include a color filter array that selectively transmits red, green, and blue wavelengths.

The light emitting element layer 16 and the circuit layer 14 can be covered by a protective layer. The protective layer and the encapsulation layer 18 can be composed of an inorganic film made of glass, metal, aluminum oxide (AlOx) or silicon (Si)-based material, or can have a structure in which an organic film and an inorganic film are alternately stacked. The inorganic membrane blocks the penetration of moisture or oxygen. The organic film flattens the surface of the inorganic film. When the organic film and the inorganic film are stacked in multiple layers, the passage of moisture or oxygen is longer than that of a single layer, such that the penetration of moisture/oxygen affecting the light emitting element layer 16 can be effectively blocked.

The polarizing plate 20 can be adhered to the encapsulation layer 18 with an adhesive 19. The polarizing plate 20 can be bent and extended at an edge region except for a region where pads connected to an external circuit are formed, and be in contact with the upper surface of the organic film 12. The polarizing plate 20 improves outdoor visibility of the display device. The polarizing plate 20 improves brightness of pixels by reducing light reflected from the surface of the display panel 100 and blocking light reflected from the metal of the circuit layer. The polarizing plate 20 can be implemented as a circular polarizing plate or a polarizing plate in which a linear polarizing plate and a phase delay film are bonded. A transparent cover window 22 can be disposed on the polarizing plate 20.

The glass substrate 10 can be fabricated from plate-shaped alkali-free glass or non-alkali glass. The glass substrate 10 can be divided into a bending portion 100f and non-bending portions 101 and 102. The non-bending portions 101 and 102 can include a first region 101 and a second region 102.

In one embodiment, the first region 101 can include a pixel array on which an image is displayed, and the second region 102 can include an IC mounting region on which a drive integrated circuit (IC) for driving pixels is mounted. In another embodiment, the first region 101 can include a pixel array in which an image is displayed, and at least a part of the second region 102 can include a pixel array in which an image or preset additional information is displayed. In FIG. 4, the second region 102 is shown as an IC mounting region, but this is only exemplary.

Referring to FIG. 5A, the glass substrate 10 can be removed at a region of the bending portion 100f. In other words, the glass substrate 10 can be formed to expose the organic film 12 located on the bending portion 100f to the rear surface of the display panel 100. The organic film 12 can be a film including one selected from the group consisting of a polyester-based polymer, a silicone-based polymer, an acrylic polymer, a polyolefin-based polymer, and a copolymer thereof, as described above.

When the glass substrate 10 is removed at the bending portion 100f, there can be an advantage of facilitating bending of the display panel 100. For example, when only the organic film 12 is present at the lower portion of the bending portion 100f, it is possible to have an advantage of minimizing stress applied to the display panel when the display panel is bent.

Referring to FIGS. 5B to 5D and 6B, the display panel 100 can further include a coating layer 30 on a rear surface of the glass substrate 10 shown in FIG. 5A.

As shown in FIG. 5B, the coating layer 30 can be formed on an entire rear surface of the glass substrate 10 to fill the opening of the glass substrate 10 exposing the organic layer 12. For example, the coating layer 20 can be formed on the entire rear surface of the substrate including the pad portion and the region adjacent to the pad portion. In this case, the polarizing plate 20 may not be formed on the pad portion.

As shown in FIG. 5C, the coating layer 30 can be formed on the rear surface of the glass substrate 10 so as not to overlap the pat portion and the area adjacent to the pad portion of the glass substrate 10. In this case, the polarizing plate 20 may not be formed on the pad portion.

Figure 5D:
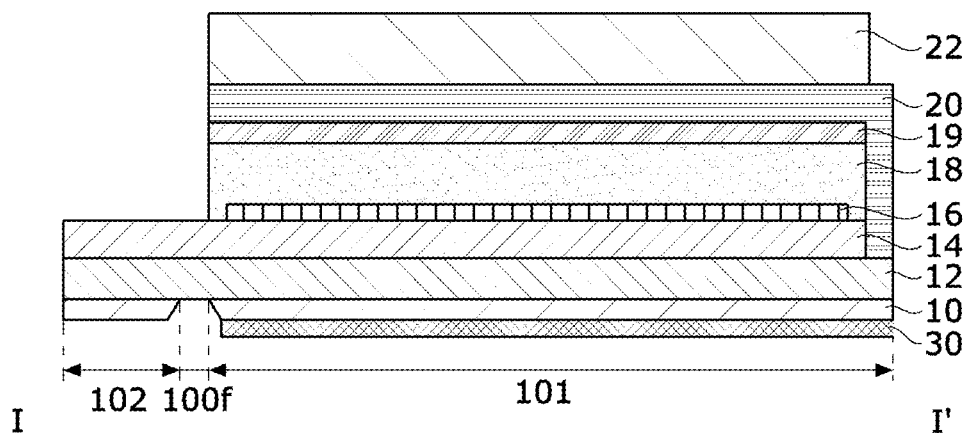

As shown in FIG. 5D, the coating layer 30 can be formed on the rear surface of the glass substrate 10 so as not to overlap the pat portion, the area adjacent to the pad portion and the opening of the glass substrate 10. In this case, the polarizing plate 20 may not be formed on the pad portion.

The coating layer 30 can be formed using a material having a good stretchability in order to improve a bending characteristics of the display panel. This is to prevent a decrease in rigidity when the glass substrate 10 is thinned. Alternatively, the coating layer 30 can be formed in the form of a reinforcing film capable of preventing scratches on the glass substrate 10.

The coating layer 30 can be formed of an organic material including, for example, a polyester-based polymer or an acrylic-based polymer.

Figure 7:
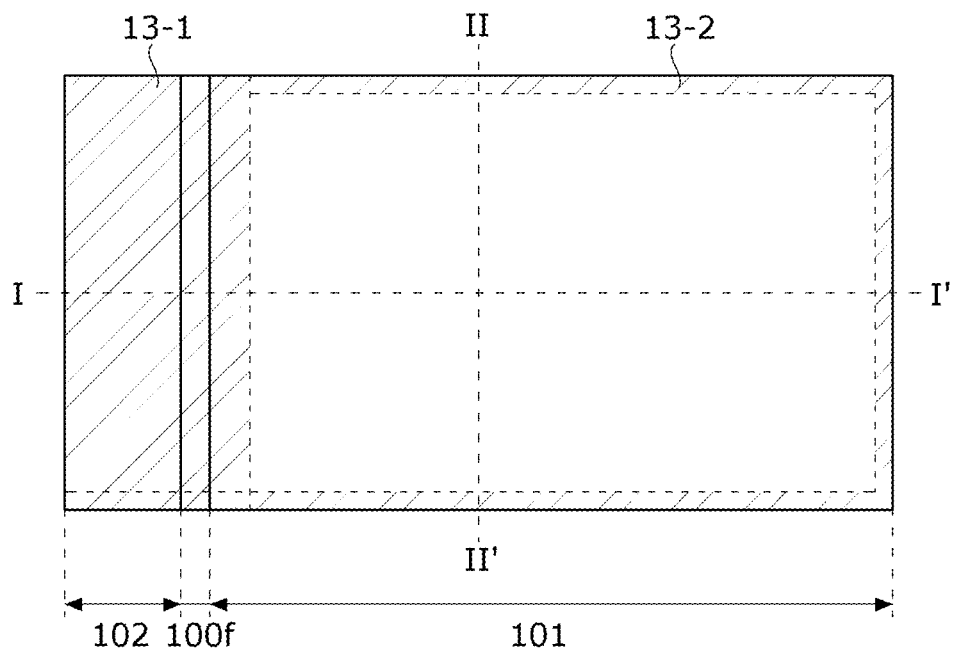
FIG. 7 is a plan view of a display panel according to another embodiment of the present disclosure.

FIG. 7 is a plan view of a display panel according to a second embodiment of the present disclosure.

FIGS. 8A to 8D are cross-sectional views taken along line I-I' in FIG. 7.

Figure 8A:
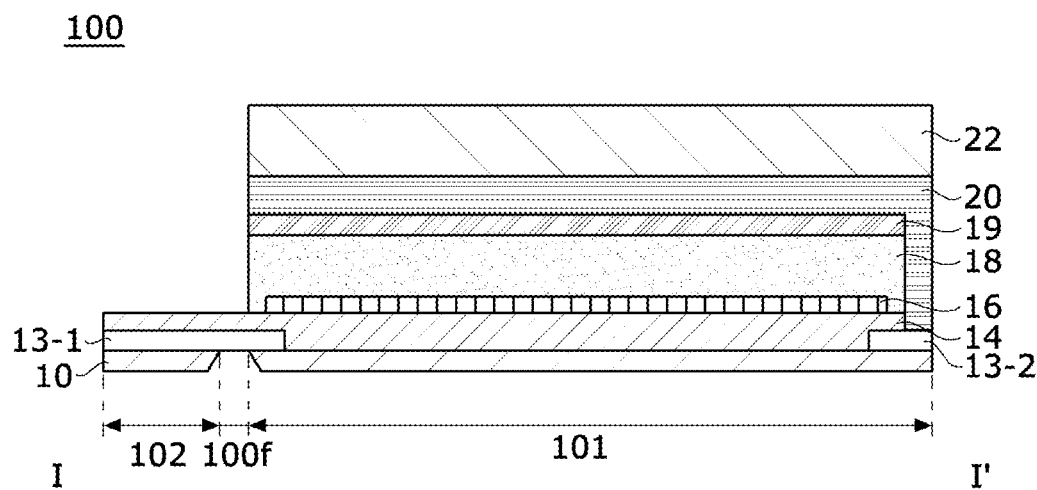
FIGS. 8A to 8D are cross-sectional views taken along line I-I' in FIG. 7.
Figure 8B:
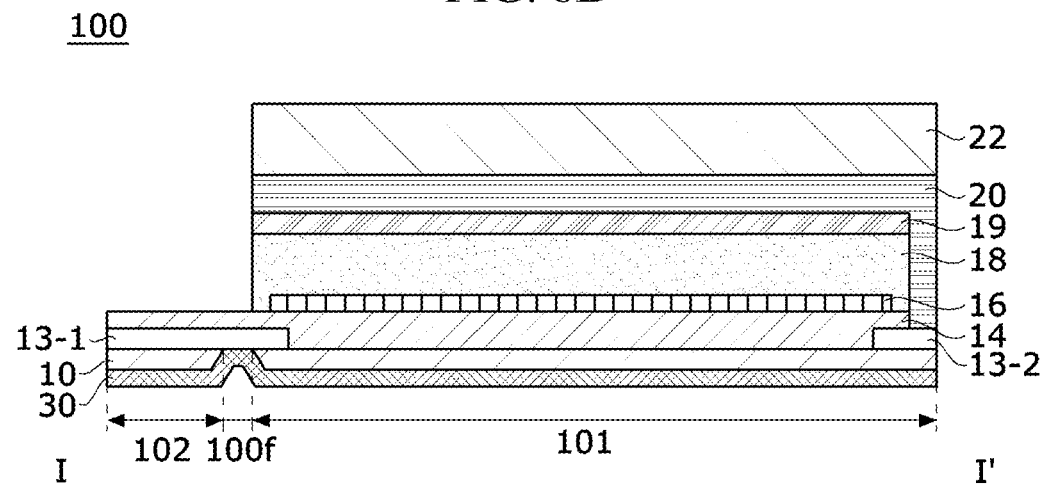
Figure 8C:
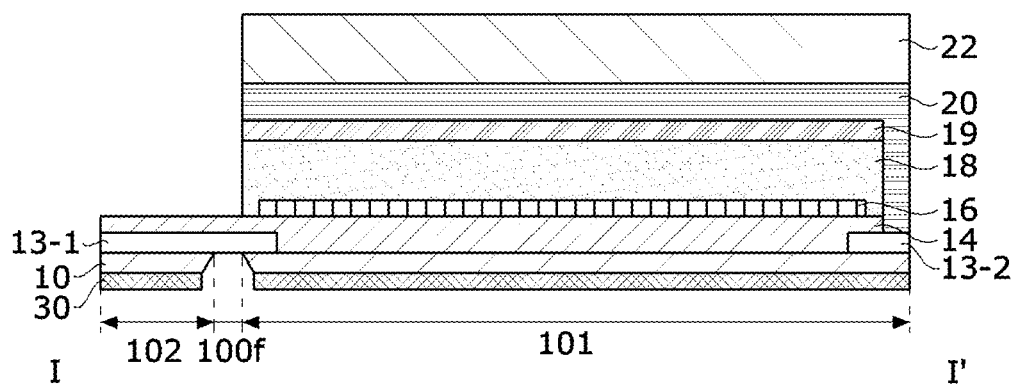
Figure 8D:
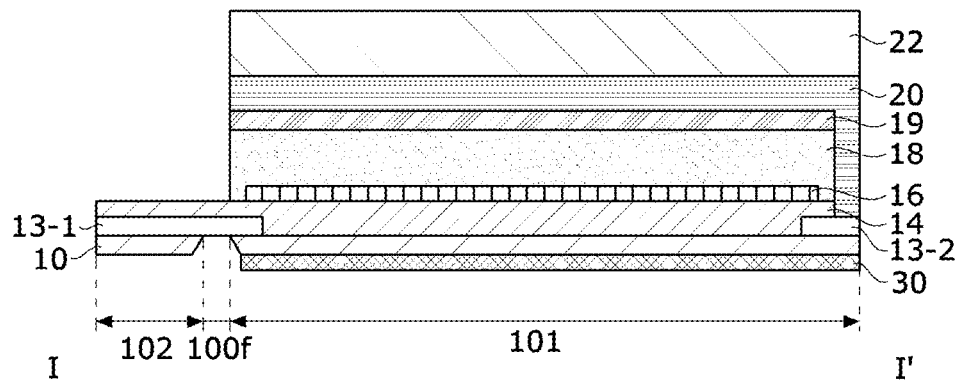
Figure 9A:
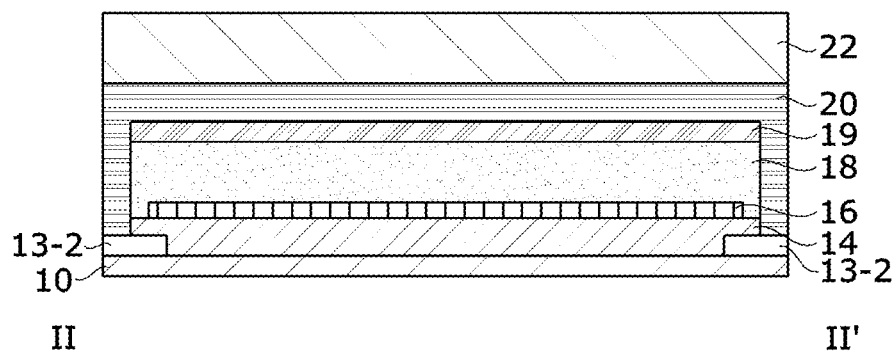
FIGS. 9A and 9B are a cross-sectional view taken along line II-II' in FIG. 7.
Figure 9B:
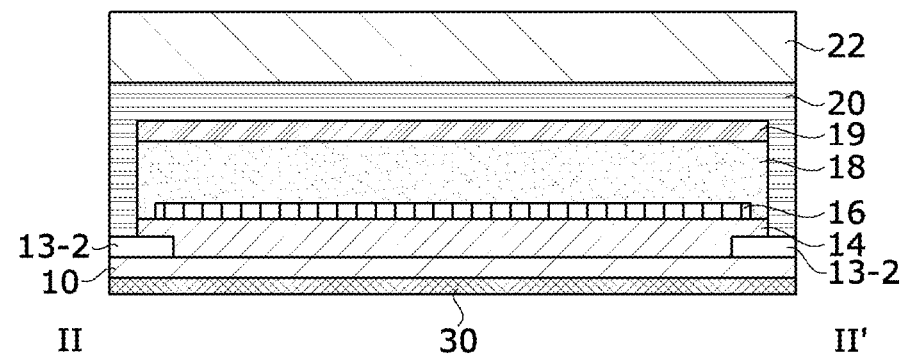

FIGS. 9A and 9B are cross-sectional views taken along line II-II' in FIG. 7. FIG. 9A is a cross-sectional view corresponding to FIG. 8. FIG. 9B is a cross-sectional view corresponding to FIGS. 8B to 8D.

Hereinafter, the display panel 100 according to the second embodiment will be described with reference to FIGS. 7 to 9B. Constituent elements that are substantially the same as those of the first embodiment are denoted by the same reference numerals, and the description thereof will be briefly described and the differences will be mainly described.

Referring to FIG. 7, the display panel 100 according to the second embodiment can include a bending portion 100f and non-bending portions 101 and 102. The non-bending portions 101 and 102 can include a first region 101 and a second region 102. The first region 101 can be a display region. The second region 102 can be an IC region in which a drive IC for driving the first region 101 is disposed. However, the present disclosure is not limited thereto, and as described above, the second region 102 can be a sub-display region. The display panel 100 according to the second embodiment can include a part of the first region 101, the bending portion 100f, and a partial organic film 13-1 formed over the second region 102.

Hereinafter, a stacked structure of the display panel 100 according to the second embodiment will be described in detail with reference to FIGS. 8A to 8D, and FIGS. 9A and 9B.

Referring to FIG. 8A and FIG. 9, the display panel 100 includes a glass substrate 10, a circuit layer 14 sequentially disposed on the glass substrate 10, and a light emitting element layer 16. The display panel 100 can further include an encapsulation layer 18 covering the circuit layer 14 and the light emitting element layer 16, a polarizing plate 20 attached to the encapsulation layer 18 by an adhesive agent 19, and a cover window 22 on the polarizing plate 20.

The display panel 100 according to the second embodiment can further include a partial organic film 13-1 disposed between the glass substrate 10 and the circuit layer 14. More specifically, the partial organic film 13-1 can be disposed between the glass substrate 10 and the circuit layer 14 on the second region 102, the bending portion 100f, and a portion of the first region 101 adjacent to the bending portion 100f.

The display panel 100 according to the second embodiment can further include a protective organic film 13-2 disposed between the glass substrate 10 and the circuit layer 14. More specifically, the protective organic film 13-2 can be disposed along the edge of the first region 101 on the glass substrate 10. The role of the protective organic film 13-2 will be described later.

The polarizing plate 20 can be arranged similarly to that in the first embodiment. For example, the polarizing plate 20 is bent and extended in the remaining edge region except for the region where pads connected to an external circuit are formed, and to be disposed to contact the upper surfaces of the partial organic film 13-1 and the protective organic film 13-2.

Similar to the display panel 100 according to the first embodiment, the glass substrate 10 can be removed at the bending portion 100f. In other words, the glass substrate 10 can be formed to expose the partial organic film 13-1 located on the bending portion 100f to the rear surface of the display panel 100. The partial organic film 13-1 can be a film including one selected from the group consisting of a polyester-based polymer, a silicone-based polymer, an acrylic polymer, a polyolefin-based polymer, and a copolymer thereof.

When the glass substrate 10 is removed at the bending portion 100f, there can be an advantage that the display panel 100 can be easily bent. For example, when only the partial organic film 13-1 is present at the lower portion of the bending portion 100f, it is possible to have an advantage of minimizing stress applied to the display panel when the display panel is bent.

Referring to FIGS. 8B to 8D and 9B, the display panel 100 can further include a coating layer 30 on a rear surface of the glass substrate 10 shown in FIG. 8A.

As shown in FIG. 8B, the coating layer 30 can be formed on an entire rear surface of the glass substrate 10 to fill the opening of the glass substrate 10 exposing the partial organic film 13-1. For example, the coating layer 20 can be formed on the entire rear surface of the substrate including the pad portion and the region adjacent to the pad portion. In this case, the polarizing plate 20 may not be formed on the pad portion.

As shown in FIG. 8C, the coating layer 30 can be formed on the rear surface of the glass substrate 10 so as not to overlap the pat portion and the area adjacent to the pad portion of the glass substrate 10. In this case, the polarizing plate 20 may not be formed on the pad portion.

As shown in FIG. 8D, the coating layer 30 can be formed on the rear surface of the glass substrate 10 so as not to overlap the pat portion, the area adjacent to the pad portion and the opening of the glass substrate 10. In this case, the polarizing plate 20 may not be formed on the pad portion.

The material for forming the coating layer 30 and its function are the same as those described in FIGS. 5B to 5D, and thus will be omitted to avoid overlapping description.

Figure 10:
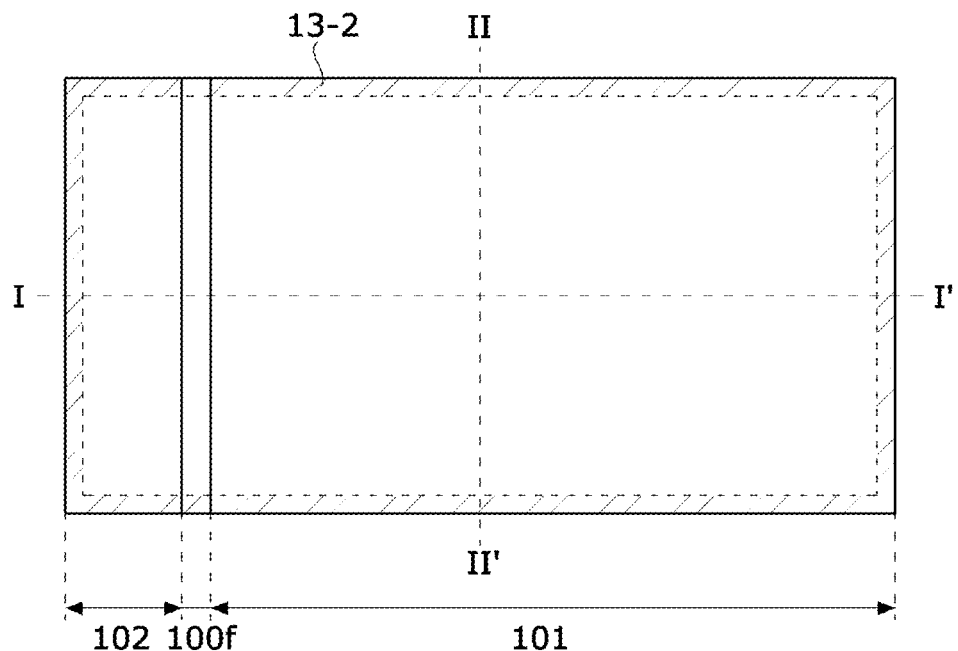
FIG. 10 is a plan view of a display panel according to another embodiment of the present disclosure.

FIG. 10 is a plan view of a display panel according to a third embodiment of the present disclosure.

FIGS. 11A to 11D are cross-sectional views taken along line I-I' in FIG. 10.

Figure 11A:
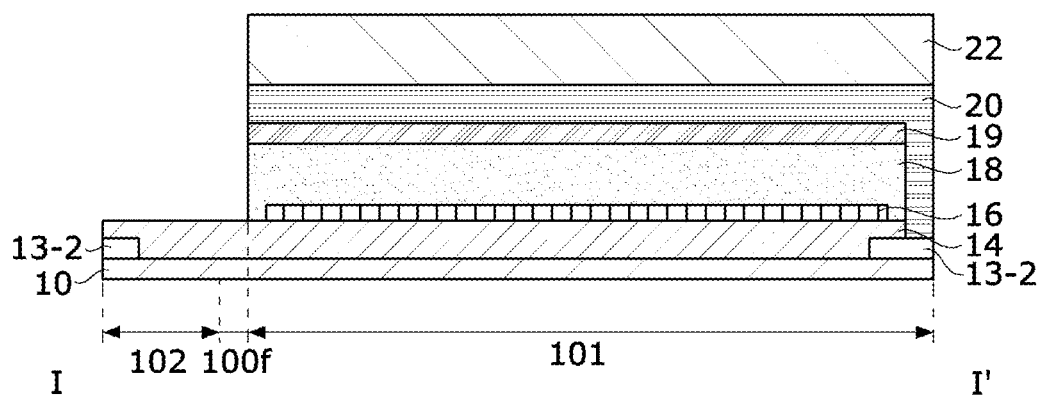
FIGS. 11A to 11D are cross-sectional views taken along line I-I' in FIG. 10.
Figure 11B:
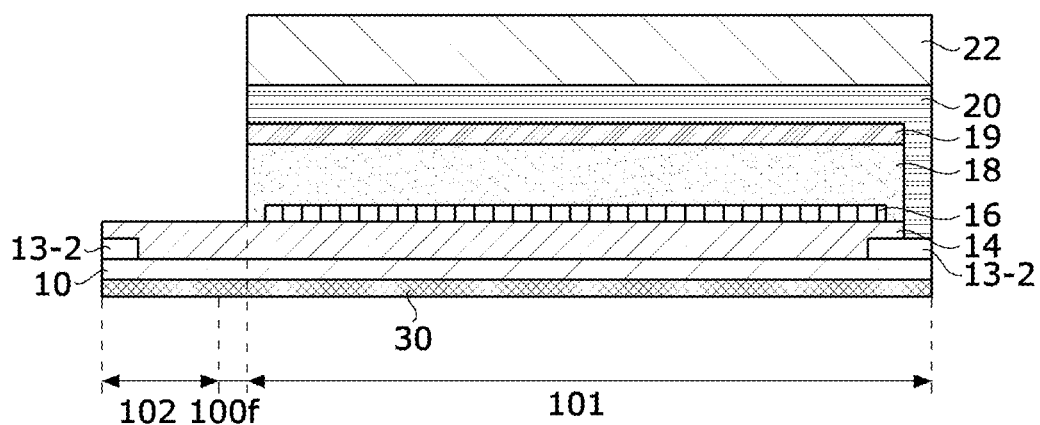
Figure 11C:
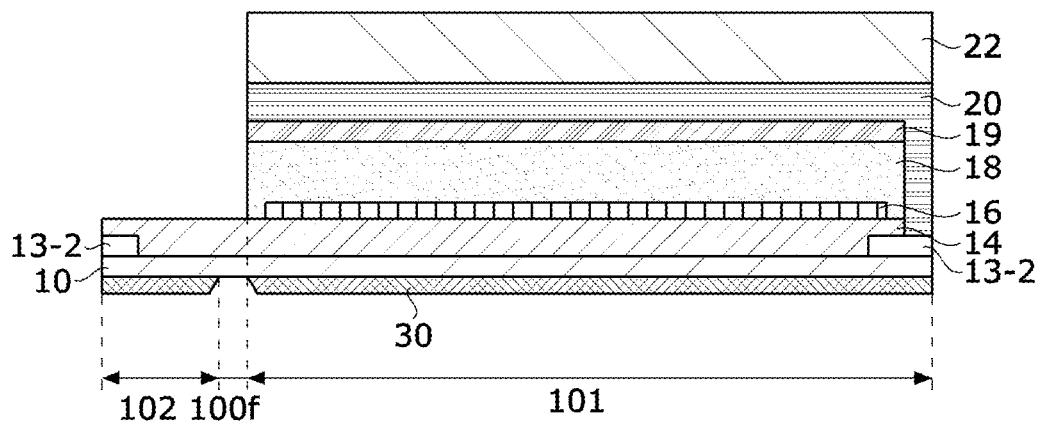
Figure 11D:
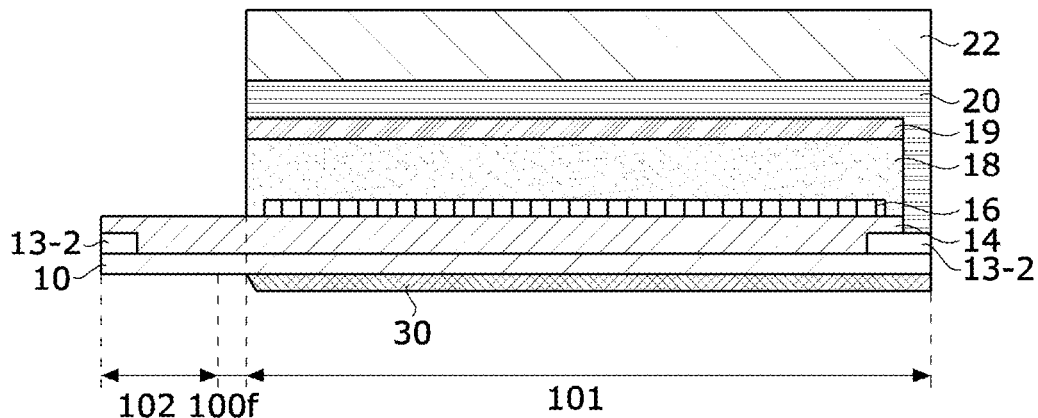
Figure 12A:
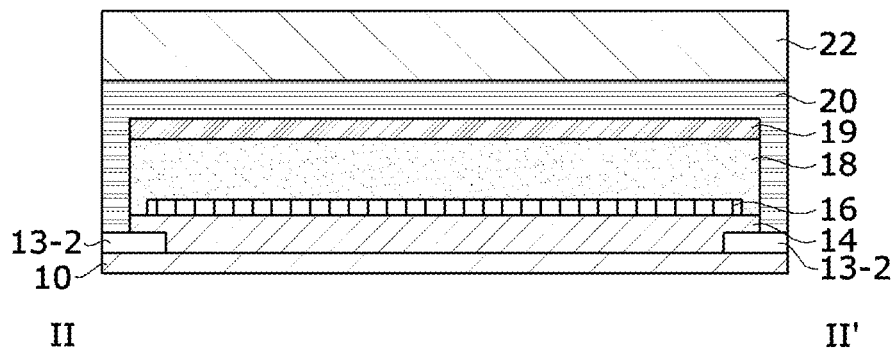
FIGS. 12A and 12B are cross-sectional view taken along line II-II' in FIG. 10.
Figure 12B:
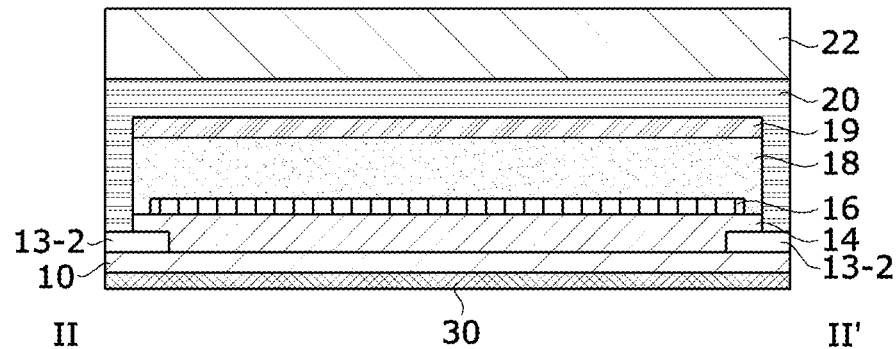

FIGS. 12A and 12B are cross-sectional views taken along line II-II' in FIG. 10. FIG. 12A is a cross-sectional view corresponding to FIG. 11A, and FIG. 12B is a cross-sectional view corresponding to FIGS. 11B to 11D.

Hereinafter, a display panel 100 according to a third embodiment will be described with reference to FIGS. 10 to 12B. Constituent elements that are substantially the same as those of the first embodiment are denoted by the same reference numerals, and the description thereof will be briefly described and the differences will be mainly described.

Referring to FIG. 10, the display panel 100 according to the third embodiment can include a bending portion 100f and non-bending portions 101 and 102. The non-bending portions 101 and 102 can include a first region 101 and a second region 102. The first region 101 can be a display region. The second region 102 can be an IC region in which a drive IC for driving the first region 101 is disposed, but is not limited thereto.

Hereinafter, a stacked structure of the display panel 100 according to the third embodiment will be described with reference to FIGS. 11A to 11D and FIGS. 12A and 12B.

Referring to FIGS. 11A and 12A, the display panel 100 includes a glass substrate 10, a circuit layer 14 sequentially disposed on the glass substrate 10, and a light emitting element layer 16. The display panel 100 can further include an encapsulation layer 18 covering the circuit layer 14 and the light emitting element layer 16, a polarizing plate 20 attached to the encapsulation layer 18 the by an adhesive agent 19, and a cover window on a polarizing plate 20.

The display panel 100 according to the third embodiment can further include a protective organic film 13-2 disposed between the glass substrate 10 and the circuit layer 14. More specifically, the protective organic film 13-2 can be disposed at the edge of the first region 101. The role of the protective organic film 13-2 will be described later.

The polarizing plate 20 can be arranged similarly to that in the first embodiment. For example, the polarizing plate 20 is bent and extended in the remaining edge region except for the region where pads connected to an external circuit are formed, and to be disposed to contact the upper surfaces of the protective organic film 13-2.

Unlike the display panel 100 according to the first and second embodiments, the display panel 100 according to the third embodiment may not remove the glass substrate 10 at the bending portion 100f. Even if the glass substrate 10 at the bending portion 100f is not removed, when the glass substrate 10 is formed thin enough, it is possible to bend with a sufficiently large curvature with only the glass substrate 10. The glass substrate 10 formed thinly can be flexibly bent and can have acid resistance and heat resistance characteristics. Accordingly, in the third embodiment, the circuit layer 14 can be directly mounted on the glass substrate 10 formed thinly.

As a modified example, in FIGS. 11A to 11D, the thickness of the glass substrate 10 of the bending portion 100f and the thickness of the glass substrate 10 of the non-bending portions 101 and 102 can be formed differently. For example, in order to facilitate bending, the glass substrate 10 of the bending portion 100f can be formed to be thinner than the glass substrate 10 of the non-bending portions 101 and 102.

The display panel 100 according to the third embodiment can further include a protective organic film 13-2 disposed between the glass substrate 10 and the circuit layer 14. More specifically, the protective organic film 13-2 can be disposed along the edge of the first region 101 and edges of the second region 102 and the bending portion 100f on the glass substrate 10 as shown in FIG. 10. The role of the protective organic film 13-2 will be described later.

Referring to FIGS. 11B to 11D and 12B, the display panel 100 can further include a coating layer 30 on a rear surface of the glass substrate 10 shown in FIG. 11A.

As shown in FIG. 11B, the coating layer 30 can be formed on an entire rear surface of the glass substrate 10 to fill the opening of the glass substrate 10 exposing the organic layer 12. For example, the coating layer 20 can be formed on the entire rear surface of the substrate including the pad portion and the region adjacent to the pad portion. In this case, the polarizing plate 20 may not be formed on the pad portion.

As shown in FIG. 11C, the coating layer 30 can be formed on the rear surface of the glass substrate 10 so as not to overlap the pat portion and the area adjacent to the pad portion of the glass substrate 10. In this case, the polarizing plate 20 may not be formed on the pad portion.

As shown in FIG. 11D, the coating layer 30 can be formed on the rear surface of the glass substrate 10 so as not to overlap the pat portion, the area adjacent to the pad portion and the opening of the glass substrate 10. In this case, the polarizing plate 20 may not be formed on the pad part.

The material for forming the coating layer 30 and its function are the same as those described in FIGS. 5B to 5D, and thus will be omitted to avoid overlapping description.

The display panel according to the above-described embodiment can be used as a flexible display panel. In this case, the glass substrate 10 can be fabricated to a sufficiently thin thickness so that it can be bent at the required curvature of the application product.

The glass substrate 10 fabricated thinly can be flexible, but when an impact is applied to the edge sidewalls and corners, cracks can be occurred or be damaged. In order to distribute the impact or stress applied from the outside in a weak portion of the glass substrate 10 fabricated thinly, the sidewall of the edge of the glass substrate 10 can be processed in a wedge type.

Figure 13:
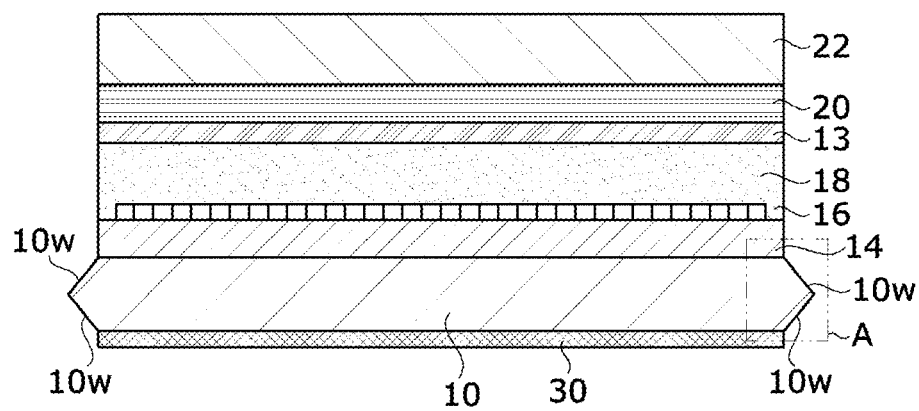
FIG. 13 is a cross-sectional view of a display panel according to an embodiment of the present disclosure.

FIG. 13 is a cross-sectional view of a display panel according to a fourth embodiment of the present disclosure.

Figure 14:
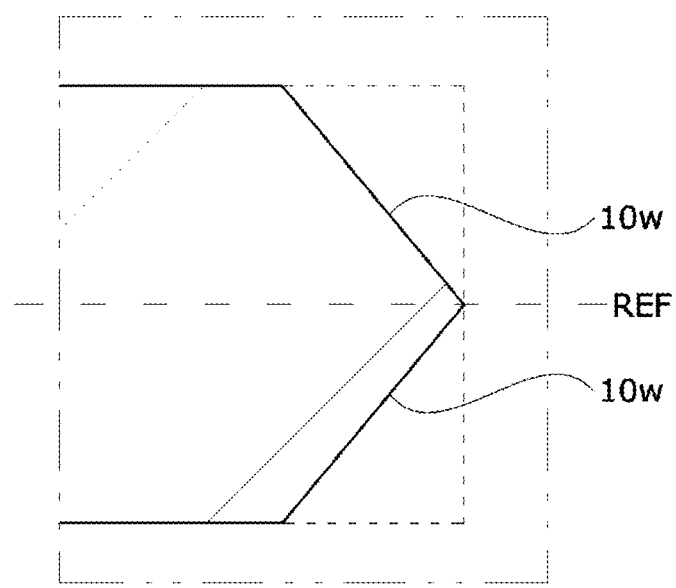
FIG. 14 is an enlarged view of a sidewall portion A of a wedge-type substrate in FIG. 13.

FIG. 14 is an enlarged view of a sidewall portion A of a wedge-type substrate in FIG. 13.

The fourth embodiment of FIG. 13 is an embodiment of a display panel to which a wedge-type substrate is applied, and the wedge-type glass substrate of FIG. 13 can be applied instead of the substrates of the first to third embodiments described above.

Referring to FIGS. 13 and 14, the display panel 100 according to the fourth embodiment includes a glass substrate 10, a circuit layer 14 stacked on the glass substrate 10, and a light emitting element layer 16. The display panel 100 can further include an encapsulation layer 18 covering the circuit layer 14 and the light emitting element layer 16, a polarizing plate 20, and a cover window 22. The display panel 100 can further include a touch sensor layer 13 disposed between the encapsulation layer 18 and the polarizing plate 20. Touch sensor wirings can be formed connecting the touch sensors to the touch sensor layer 13 and the touch sensors to the touch sensor driver.

It is preferable that the glass substrate 10 has a thin thickness, for example, 200 μm or less so that it can be flexibly bent. As in the above-described embodiment, the organic film 12 is disposed on the glass substrate 10, or the protective organic film 13-2 is disposed on the edge of the glass substrate 10. Alternatively, as in the above-described embodiment, the partial organic film 13-1 can be disposed between the first region 101 and the second region 102 on the glass substrate 10, for example, on the bending portion 100f.

The sidewall of the edge of the glass substrate 10 can be processed in a wedge type. The sidewall of the corner portion where the two sides meet on the glass substrate 10 can also be processed in the wedge type. The wedge type means a symmetrical shape in which each tapered surface of the upper half-thick portion and the lower half-thick portion of the glass substrate 10 is formed with respect to the thickness center REF of the glass substrate 10 as shown in FIG. 14 when viewed from the cross section of the edge of the glass substrate 10. Accordingly, the thickness of the glass substrate 10 gradually decreases from the edge to the sidewall due to the upper/lower symmetrical tapered surface 10w. The tapered portion at the glass substrate 10 protrudes out of the circuit layer 14, and the thickness becomes thinner toward the end of the sidewall of the glass substrate 10.

The coating layer 30 can be formed on the entire rear surface of the glass substrate 10. The coating layer 30 can reinforce rigidity when the wedge-type glass substrate 10 is thinly formed, and can prevent scratches on the glass substrate 10.

Hereinafter, a method of manufacturing a display panel according to an embodiment will be described with reference to FIGS. 15 to 20.

Figure 15:
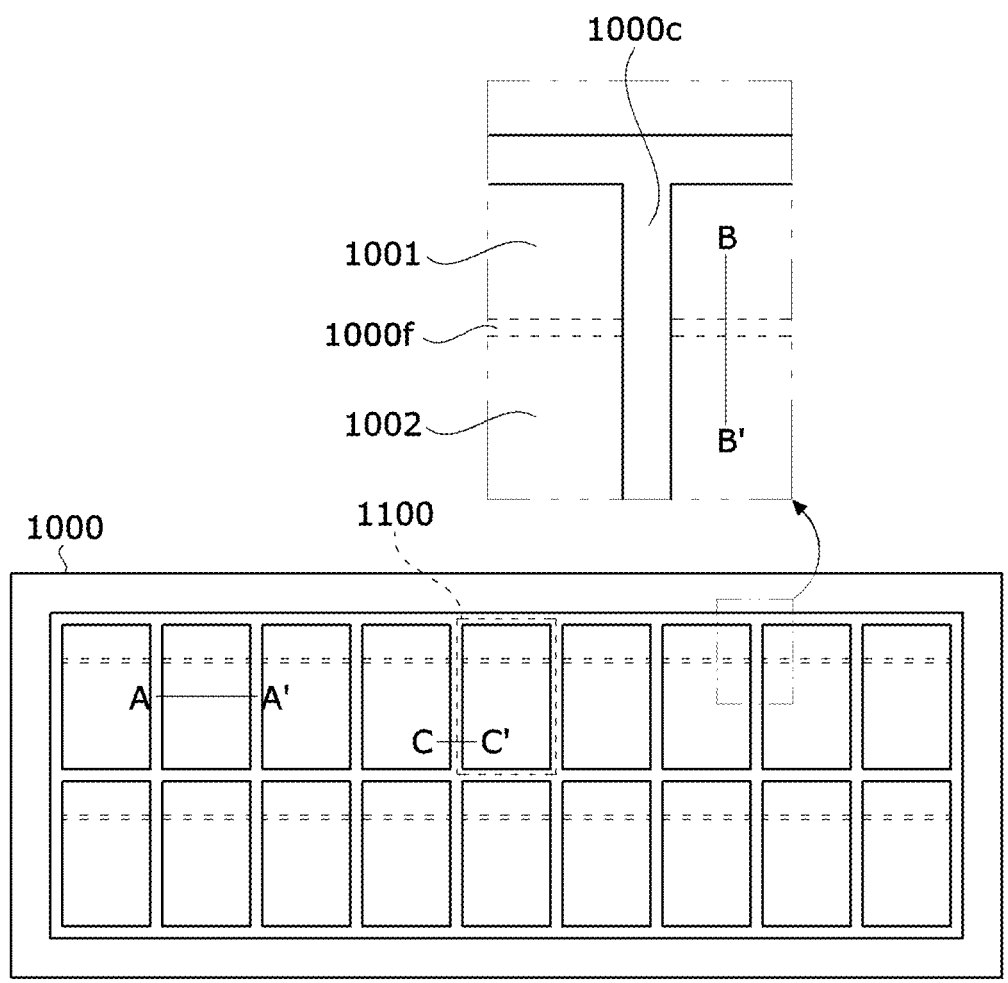
FIG. 15 is a view showing a mother substrate according to an embodiment of the present disclosure.

FIG. 15 is a view showing a mother substrate according to an embodiment of the present disclosure.

Referring to FIG. 15, in the display panel 100 according to the embodiment, a process of forming a thin film in a plurality of cells 1100 on a mother substrate 1000, which is a large glass substrate, is simultaneously formed. Hereinafter, for convenience of description, the mother substrate 1000 according to the embodiment is referred to as a mother glass substrate 1110. Here, one cell 1100 preferably can mean one display panel.

A plurality of display panels 100 can be simultaneously manufactured in a multi-faceted process in order to reduce cost. First, a plurality of cells 1100 can be formed on the mother substrate 1000. After the cells 1100 are formed, a cutting line 1000c can be set on the mother substrate 1000. Each of the cells 1100 can be separated (or cut) from the mother substrate 1000 with respected to the cutting line 1000c to form the display panel 100.

After setting the cutting line 1000c or at the same time, a bending line 1000f can be set on the mother substrate 1000. The bending line 1000f can be configured to form the bending portion 100f described above in each display panel after the cells 1100 are separated from the mother substrate 1000. Accordingly, the bending line 1000f can be set between non-folding portion forming regions 1001 and 1002 that will form non-folding portions after the cells 1100 are separated.

Figure 16:
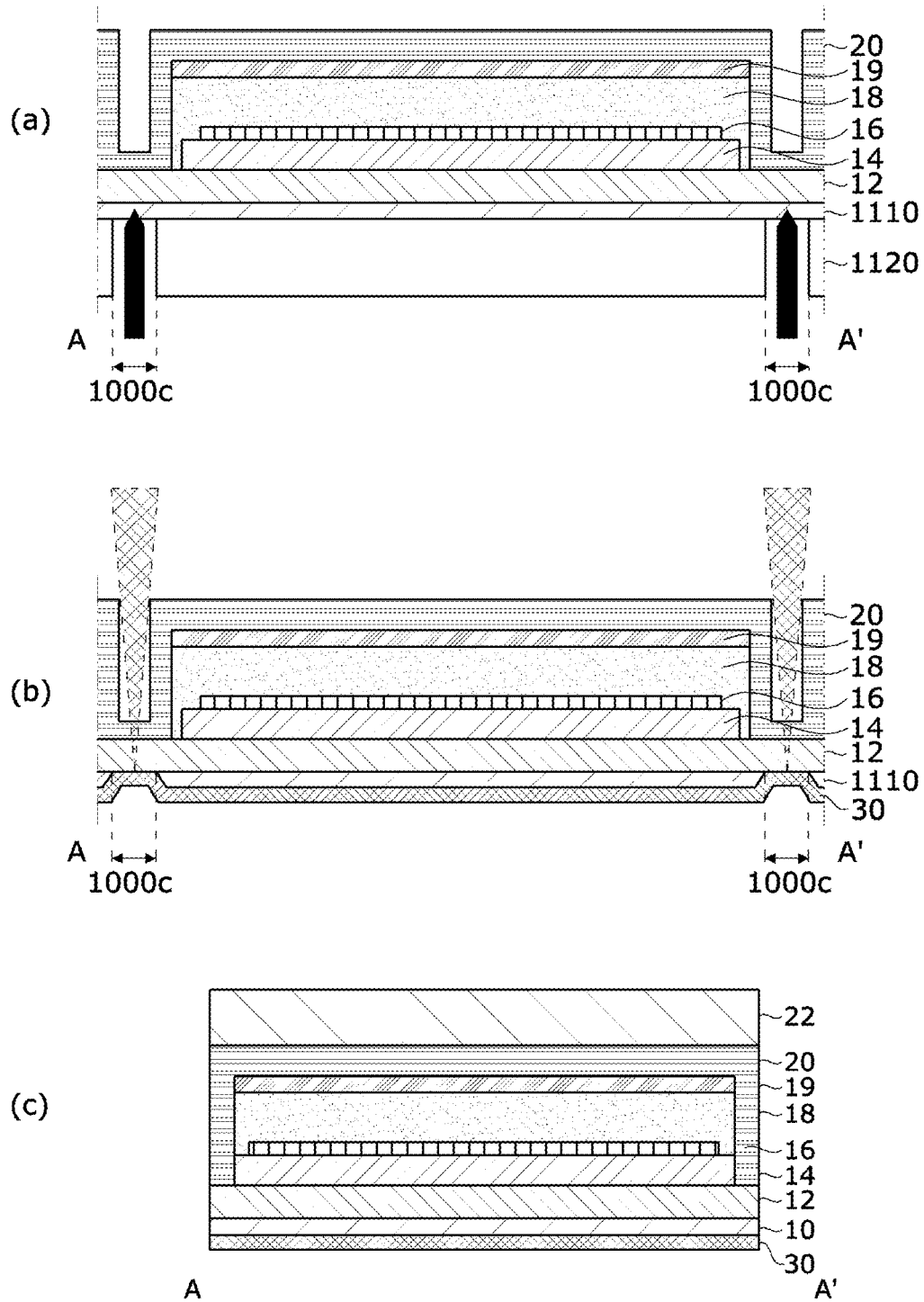
FIG. 16 is a view illustrating a manufacturing process of a display panel according to an embodiment of the present disclosure.

FIG. 16 is a diagram illustrating a manufacturing process of the display panel according to the first embodiment, and is a cross-sectional view taken along line A-A' in FIG. 15.

Referring to FIG. 16, a method of cutting the mother substrate 1000 according to the cutting line 1000c will be described. Referring to (a) of FIG. 16, an organic film 12 is formed on a mother glass substrate 1110, which is a glass substrate that has not yet been cut. The organic film 12 includes a cell organic film disposed on each of the cells 1100 and a cutting line organic film disposed in the cutting line 1000c region. The cell organic film and the cutting line organic film are one film connected to each other. For example, the organic film 12 can be formed by entirely coating an organic material on the mother glass substrate 1110. As described above, the circuit layer 14 is formed on the organic film 12 and the light emitting element layer 16 is formed on the circuit layer 14. An encapsulation layer 18 is formed on the emitting element layer, and a polarizing plate 20 is formed on the encapsulation layer 18. The polarizing plate 20 can be bent and extended at an edge region except for a region where pads connected to an external circuit are formed, and be in contact with the upper surface of the organic film 12. Here, the polarizing plate 20 can be a coated polarizing plate formed by a coating method, but is not limited thereto and can be a film-type polarizing plate. An adhesive 19 can be applied between the polarizing plate 20 and the encapsulation layer 18.

Thereafter, a mask 1120 can be formed on the rear surface of the mother glass substrate 1110. The mask 1120 can expose the mother glass substrate 1110 at the cutting line 1000c. In other words, the mask 1120 can include an aperture hole exposing the mother glass substrate 1110 at the cutting line 1000c.

The mother glass substrate 1110 can be wet-etched by supplying an etchant to the aperture hole formed in the mask 1120 formed on the rear surface of the mother glass substrate 1110. The organic film 12 disposed on the mother glass substrate 1110 prevents the etchant from penetrating into the circuit layer 14. For example, the organic film 12 can serve as an etch stopper. As the etchant, a hydrofluoric acid-based etchant can be used, but the present disclosure is not limited thereto.

Referring to (b) of FIG. 16, after etching the mother glass substrate 1110 near the cutting line 1000c, the mask 1120 can be removed from the mother glass substrate 1110. And then, a coating layer 30 can be formed on the rear surface of the mother glass substrate 1110. After that, each cell 1100 can be separated from the mother substrate 1000 by irradiating laser light to layers (e.g., a polarizing plate 20, an organic film 12 and a coating layer 30) located on the cutting line 1000c. When a cover window 22 is formed on the polarizing plate 20, the display panel 100 can be completed as shown in (c) of FIG. 16.

Figure 17:
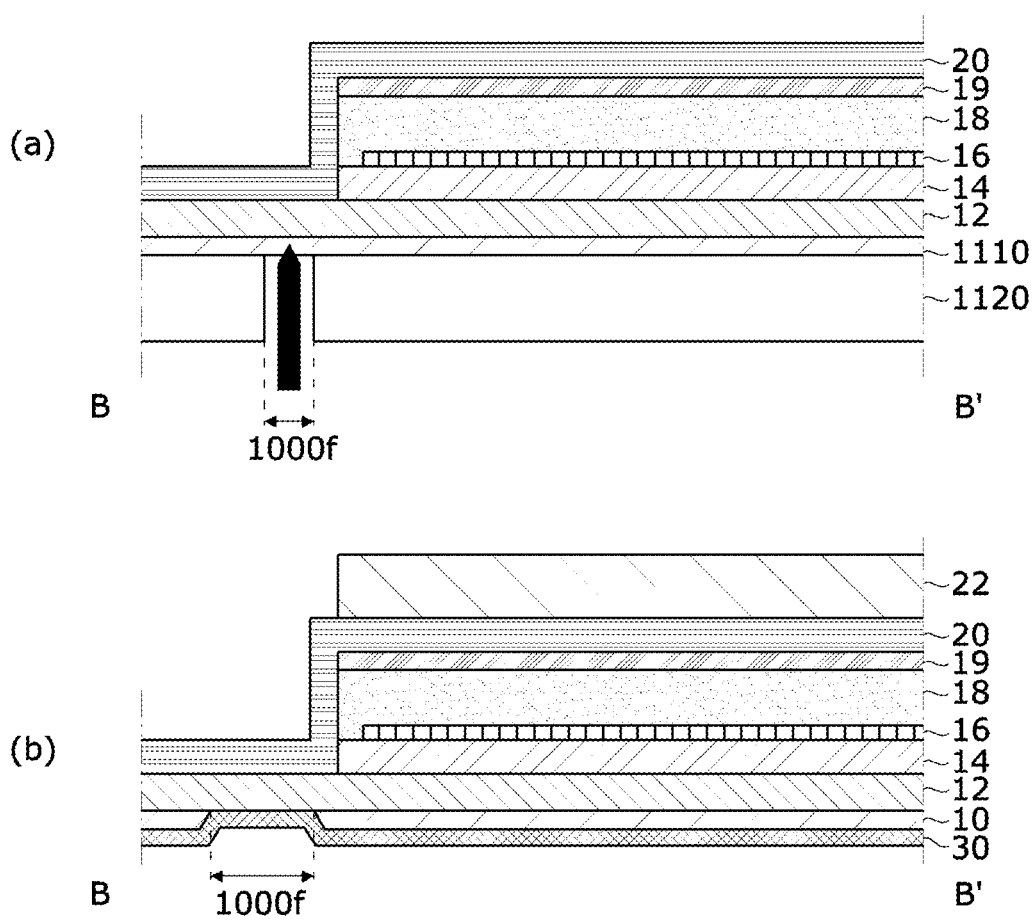
FIG. 17 is a view illustrating a manufacturing process of a display panel according to an embodiment of the present disclosure.

FIG. 17 is a diagram illustrating a manufacturing process of the display panel according to the first embodiment, and is a cross-sectional view taken along line B-B' in FIG. 15.

Referring to FIG. 17, a method of etching a part of the mother glass substrate 1110 along the bending line 1000f set on the mother substrate 1000 will be described. As described above, the reason for etching the mother glass substrate 1110 in a region of the bending line 1000f is to facilitate bending.

Referring to (a) of FIG. 17, the mask 1120 can be formed on the rear surface of the mother glass substrate 1110. The mask 1120 can expose the mother glass substrate 1110 through the bending line 1000f. In other words, the mask 1120 can include an aperture hole exposing the mother glass substrate 1110 from the bending line 1000f.

The mother glass substrate 1110 can be wet etched by supplying an etchant to the aperture hole formed in the mask 1120 formed on the rear surface of the mother glass substrate 1110. The organic film 12 arranged on the mother glass substrate 1110 prevents the etchant from penetrating into the circuit layer 14. For example, the organic film 12 can serve as an etch stopper. As the etchant, a hydrofluoric acid-based etchant can be used, but the present disclosure is not limited thereto.

Referring to (b) of FIG. 17, after etching the mother glass substrate 1110 near the bending line 1000f, the mask 1120 can be removed from the mother glass substrate 1110, a coating layer 30 can be formed on the rear surface of the mother glass substrate 1110, and a cover window 22 can be formed on the polarizing plate 20.

The mask 1120 exposing the mother glass substrate 1110 in the cutting line 1000c and the bending line 1000f is the same mask, and can be formed by the same process. In addition, the process of etching the mother glass substrate 1110 in the cutting line 1000c and the bending line 1000f is the same process and can be performed simultaneously.

Figure 18:
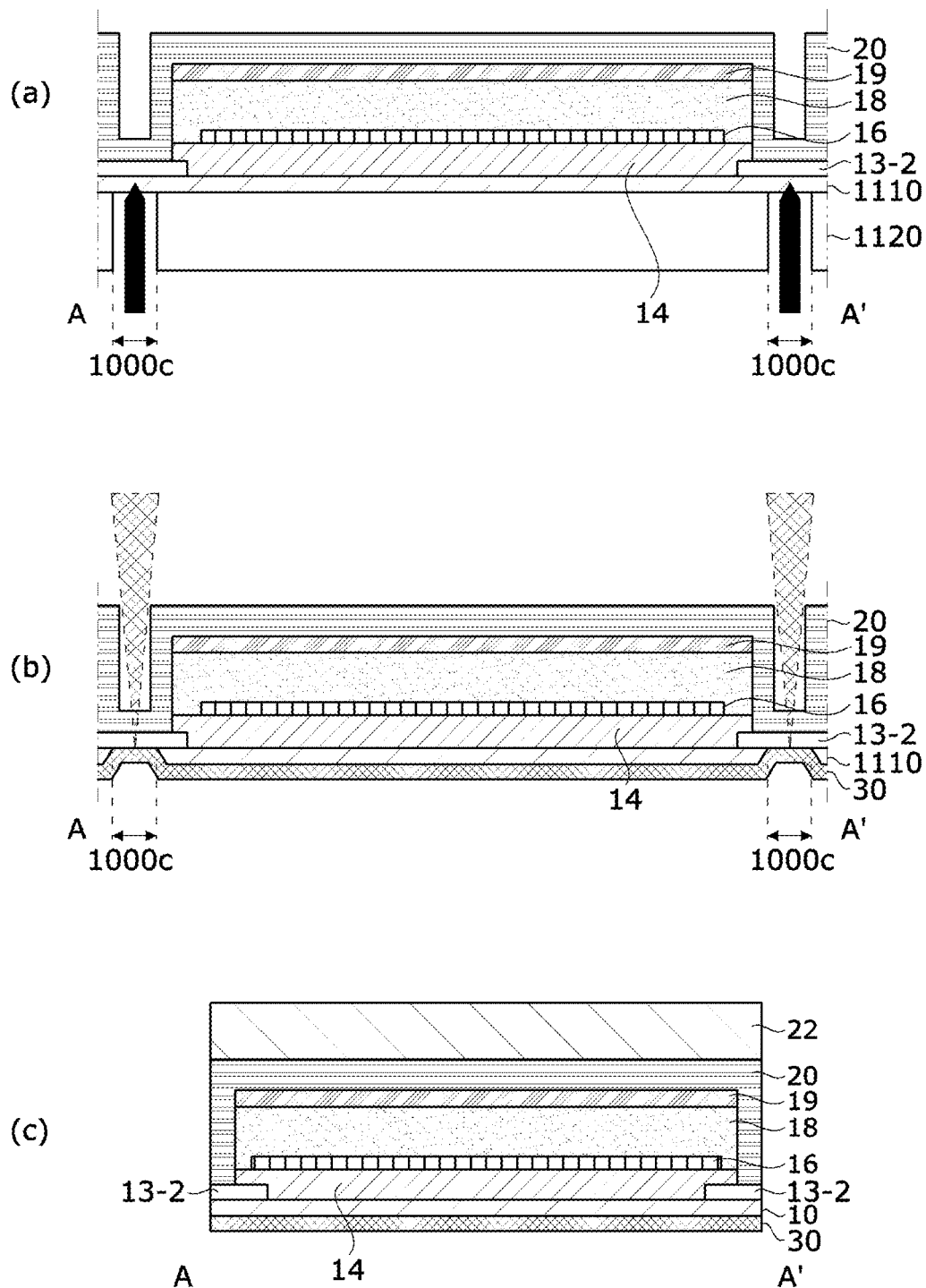
FIG. 18 is a view illustrating a manufacturing process of a display panel according to another embodiment of the present disclosure.
Figure 20:
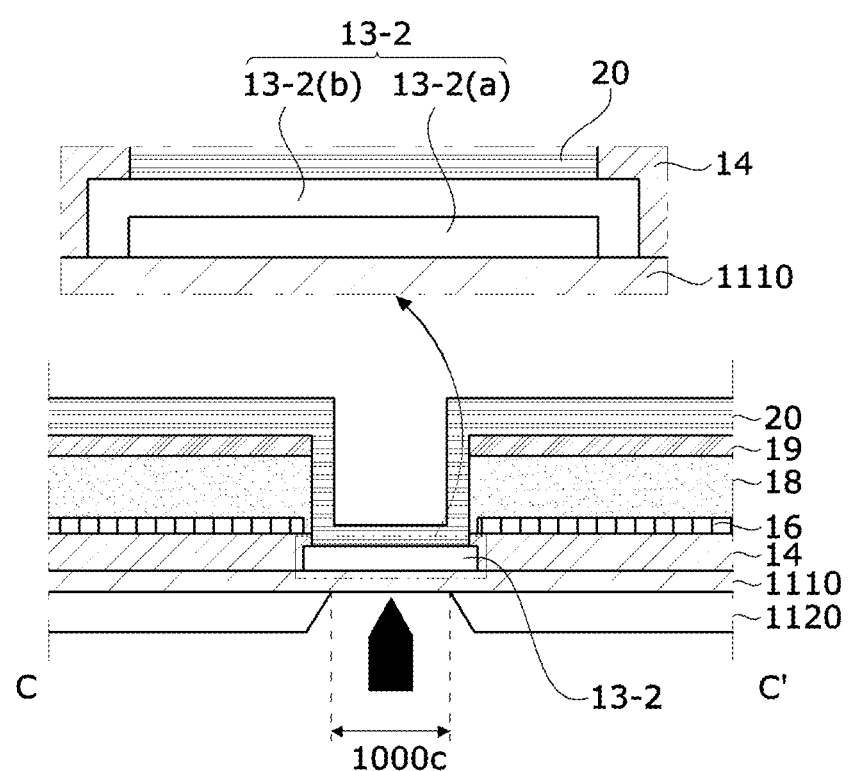
FIG. 20 is a cross-sectional view taken along line C-C' in FIG. 15.

FIG. 18 is a diagram illustrating a manufacturing process of a display panel according to the second embodiment, and is a cross-sectional view taken along line A-A' in FIG. 15. FIG. 20 is a cross-sectional view taken along line C-C' in FIG. 15.

With reference to FIGS. 18 and 20, a method of cutting the mother substrate 1000 according to the second embodiment along the cutting line 1000c will be described.

Referring to (a) of FIG. 18, a protective organic film 13-2 is formed on a mother glass substrate 1110, which is a glass substrate that has not yet been cut. Referring to FIG. 20, the protective organic film 13-2 can be formed in a boundary region between the cell 1100 and the cell 1100. The circuit layer 14 is formed on the mother glass substrate 1110, and the light emitting element layer 16 is formed on the circuit layer 14. The encapsulation layer 18 is formed on the emitting element layer, and the polarizing plate 20 is formed on the encapsulation layer 18. The adhesive 19 can be applied between the polarizing plate 20 and the encapsulation layer 18. The polarizing plate 20 can be bent and extended at an edge region except for a region where pads connected to an external circuit are formed, and be in contact with the upper surface of the protective organic film 13-2.

Thereafter, the mask 1120 can be formed on the rear surface of the mother glass substrate 1110. The mask 1120 can expose the mother glass substrate 1110 at the cutting line 1000c. In other words, the mask 1120 can include an aperture hole exposing the mother glass substrate 1110 in the cutting line 1000c.

The mother glass substrate 1110 can be wet etched by supplying an etchant to the aperture hole formed in the mask 1120 formed on the rear surface of the mother glass substrate 1110. The protective organic film 13-2 disposed on the mother glass substrate 1110 prevents the etchant from penetrating into the circuit layer 14. For example, the protective organic film 13-2 can serve as an etch stopper. As the etchant, a hydrofluoric acid-based etchant can be used, but the present disclosure is not limited thereto.

Referring to (b) of FIG. 18, after etching the mother glass substrate 1110 near the cutting line 1000c, the mask 1120 can be removed from the mother glass substrate 1110, and a coating layer 30 can be formed on the rear surface of the mother glass substrate 1110. After that, each cell 1100 can be separated from the mother substrate 1000 by irradiating laser light to layers (e.g., the polarizing plate 20, the organic film 12 and the coating layer 30) located on the cutting line 1000c. When the cover window 22 is formed on the polarizing plate 20, the display panel 100 can be completed as shown in (c) of FIG. 18.

Figure 19:
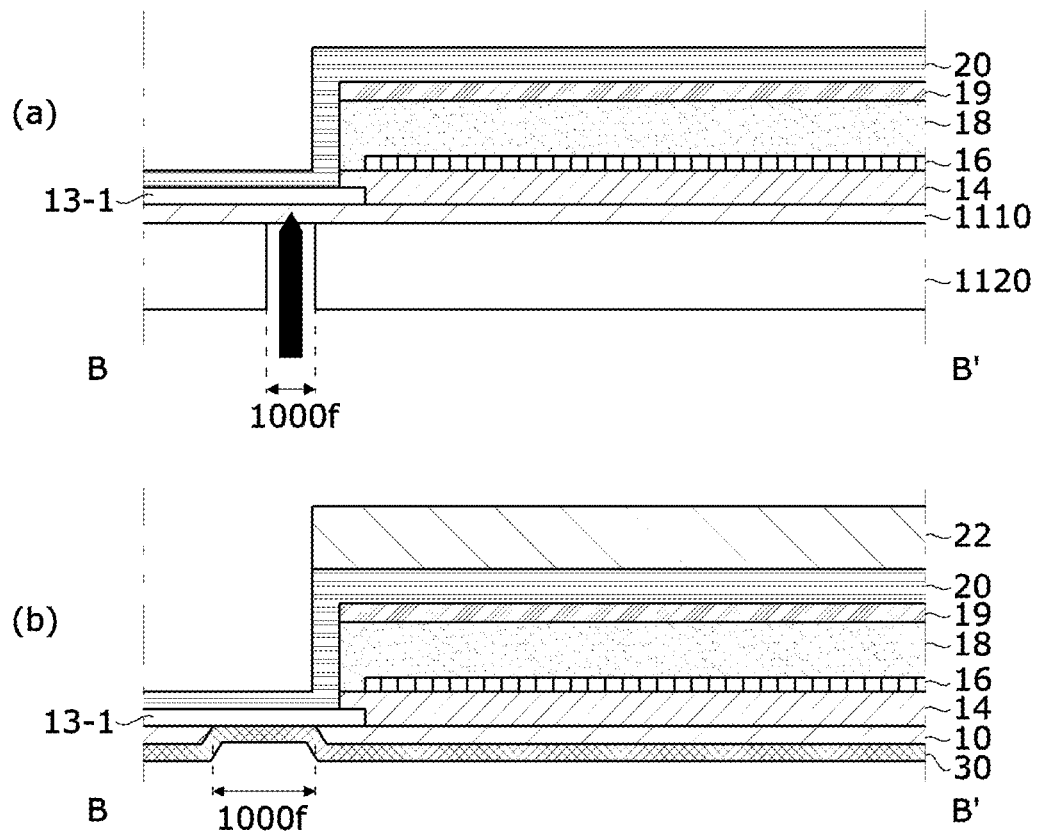
FIG. 19 is a view illustrating a manufacturing process of a display panel according to another embodiment of the present disclosure.

FIG. 19 is a diagram illustrating a manufacturing process of a display panel according to the second embodiment, and is a cross-sectional view taken along line B-B' in FIG. 16.

Referring to FIG. 19, a method of etching a part of the mother glass substrate 1110 along the bending line 1000f set in the mother substrate 1000 will be described.

Referring to (a) of FIG. 19, the second embodiment includes a partial organic film 13-1 disposed on the mother glass substrate 1110. The partial organic film 13-1 can be formed over a portion of the non-folding portion forming regions 1001 and 1002 and the bending line 1000f.

The mask 1120 can be formed on the rear surface of the mother glass substrate 1110. The mask 1120 can expose the mother glass substrate 1110 in the bending line 1000f. In other words, the mask 1120 can include an aperture hole exposing the mother glass substrate 1110 at the bending line 1000f.

The mother glass substrate 1110 can be wet etched by supplying an etchant to the aperture hole formed in the mask 1120 formed on the rear surface of the mother glass substrate 1110. The partial organic film 13-1 disposed on the mother glass substrate 1110 prevents the etchant from penetrating into the circuit layer 14. For example, the partial organic film 13-1 can serve as an etch stopper. As the etchant, a hydrofluoric acid-based etchant can be used, but the present disclosure is not limited thereto.

Referring to (b) of FIG. 19, after etching the mother glass substrate 1110 near the bending line 1000f, the mask 1120 is removed from the mother glass substrate 1110, a coating layer 30 can be formed on a rear surface of the mother glass substrate 1110, and a cover window 22 can be formed on the polarizing plate 20.

The mask 1120 exposing the mother glass substrate 1110 in the cutting line 1000c and the bending line 1000f is the same mask, and can be formed by the same process. In addition, the process of etching the mother glass substrate 1110 in the cutting line 1000c and the bending line 1000f is the same process and can be performed simultaneously.

Since the display panel according to the third embodiment does not have the partial organic film 13-1, it is manufactured in the same manner as in the second embodiment except that there is no process of etching the mother glass substrate 1110 at the bending line 1000f.

FIG. 20 is a cross-sectional view taken along line C-C' in FIG. 15.

Referring to FIG. 20, the role of the protective organic film 13-2 according to the embodiment will be described. When etching the mother glass substrate 1110 using wet etching, if there is no etch preventing film, for example, etch stopper, the etchant penetrates the circuit layer 14 and the light emitting element layer 16 on the substrate, such that damage can be caused. When the organic film 12 is applied on the entire surface as in the first embodiment, it is not a problem because the organic film 12 can serve as an etch stopper. However, the partial organic film 13-1 is used as in the second embodiment, or in the case of a panel that does not use an organic film as in the third embodiment, the etchant penetrates the circuit layer 14 and the emitting element layer 16 in the etching process, such that damage can be caused. In the embodiments of the present disclosure, the above-described problem can be prevented by providing a configuration capable of serving as an etch stopper such as the protective organic film 13-2 or the partial organic film 13-1 on the cutting line 1000c to be etched.

In summary, the protective organic film 13-2 is configured to prevent damage due to the etchant flowing into the circuit layer 14 and the light emitting element layer 16 in a wet etching process. In order to prevent the etchant from penetrating into the circuit layer 14 and the light emitting element layer 16, it is formed on the cutting line 1000c and can be disposed on the mother glass substrate 1110.

The protective organic film 13-2 can be a film including one selected from the group consisting of a polyimide polymer, a polyester polymer, a silicone polymer, an acrylic polymer, a polyolefin polymer, and a copolymer thereof.

The protective organic film 13-2 can have a plurality of layers as needed. In an embodiment, as shown in FIG. 20, a first organic film 13-2(a) and a second organic film 13-2(b) can be included. The first organic film 13-2(a) and the second organic film 13-2(b) can include the same material as other layers on the display panel 100. For example, the second organic film 13-2(b) can be made of the same material as a bank on the display panel 100. However, the present disclosure is not limited thereto, and any material including an organic material and capable of serving as an etch stopper can be used.

Hereinafter, a method of etching the mother glass substrate 1110 according to the embodiment will be described in more detail.

In the embodiment, a part of the mother glass substrate 1110 can be etched by a wet etching method to separate the cells 1100 disposed on the glass mother substrate 1110 or to form a bending portion 100f or a bending line 1000f In addition, in the embodiment, the mother glass substrate 1110 can be etched by a wet etching method in order to process the sidewalls of the edge of the glass substrate 10 into a desired shape.

Figure 21:
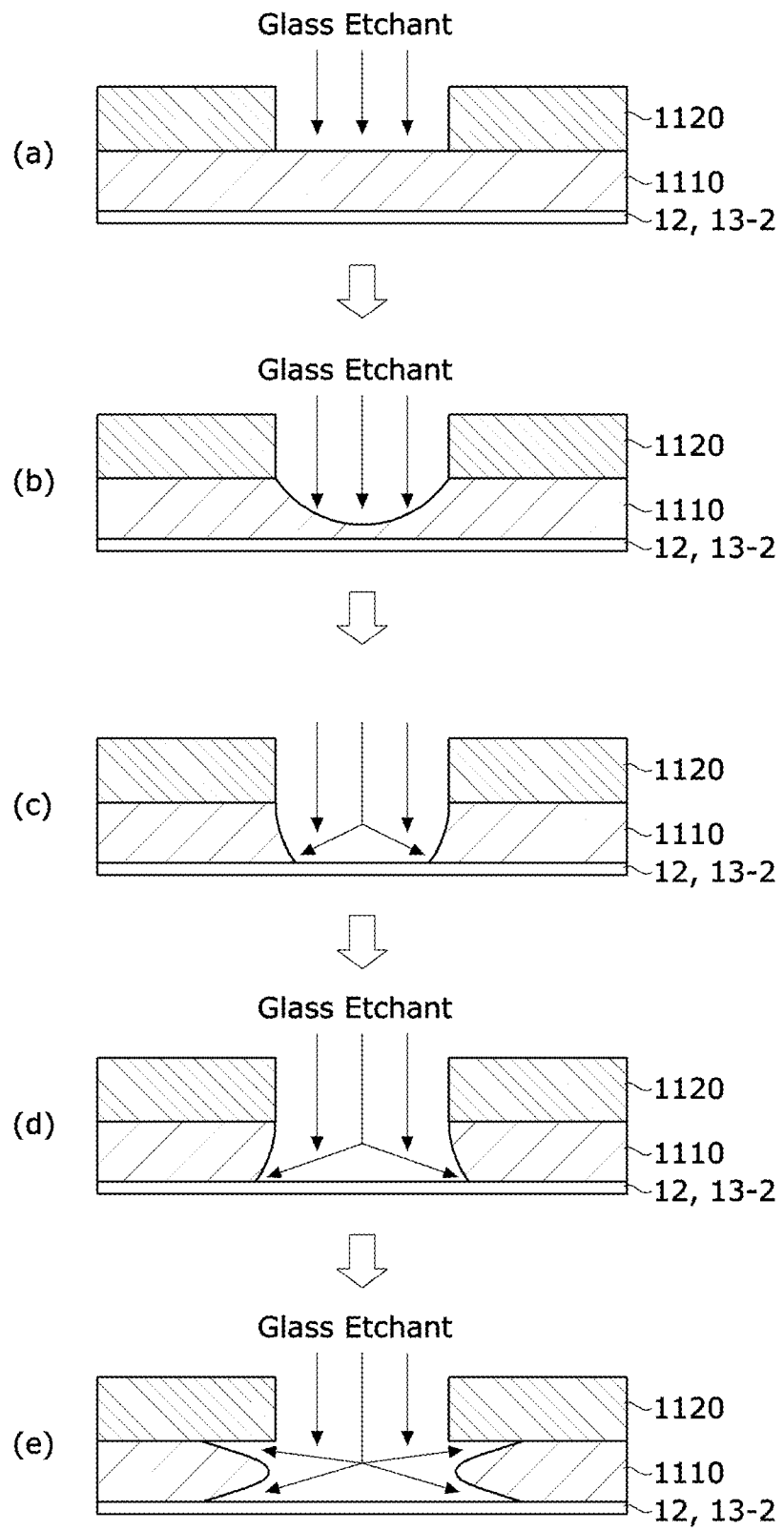
FIG. 21 is a view illustrating an etching process of a mother glass substrate according to an embodiment of the present disclosure.

FIG. 21 is a view showing the etching process of the mother glass substrate, viewed from the rear surface of the mother glass substrate upside down.

Referring to FIG. 21, the mask 1120 can be disposed on one surface of a mother glass substrate 1110, and etch preventing films 12 and 13-2 can be disposed on the other surface of the mother glass substrate 1110. The circuit layer and the organic emission layer are disposed on the etch preventing films 12 and 13-2, but are omitted for convenience of description. The mask 1120 and the etch preventing film 50 can be organic films applied or adhered to the mother glass substrate 1110. The etch preventing films 12 and 13-2 can serve as an etch stopper in the etching process, and can be the organic film 12 or the protective organic film 13-2 of the above-described embodiment. The mask 1120 can include an aperture hole exposing the glass by the etchant. The shape, thickness, spacing, and the like of the glass pattern can be determined according to the shape and spacing of the aperture hole and the etching process time. The mask 1120 can be removed after an etching process.

According to the present disclosure, the mother glass substrate 1110 can be etched by spraying the etchant onto the mother glass substrate 1110 to which the mask 1120 is bonded or by putting the mother glass substrate 1110 into a water tank containing the etchant by a deeping method.

A glass etchant is supplied to the mother glass substrate 1110 through the aperture hole of the mask 1120. The mother glass substrate 1110 exposed to the aperture hole of the mask 1120 starts to be etched in response to the glass etchant as shown in (a) of FIG. 21. As shown in (b) of FIG. 21, the glass exposed to the etchant is etched to form an opening in the mother glass substrate 1110, and the depth of the opening increases as the etching process time elapses, as shown in (c) of FIG. 21. When the etching process time is longer in the etching process, the etchant can penetrate between the mother glass substrate 1110 and the etch preventing film 50 and between the mother glass substrate 1110 and the mask 1120 to form a tapered surface on the sidewall glass of the opening, as shown in (d) and (e) of FIG. 21.

As the etching process time increases, the tapered surface begins to form on the edge of the mother glass substrate 1110 exposed to the etchant, and as the process time is further increased, the tapered surface becomes longer. In the etching process, when the lower surface of the glass substrate 10 is exposed to the etchant, the thickness of the glass substrate 10 decreases and the tapered surface becomes longer. The etching process stops when reaching the design value of the glass substrate thickness and the wedge shape of the cross section.

Figure 22:
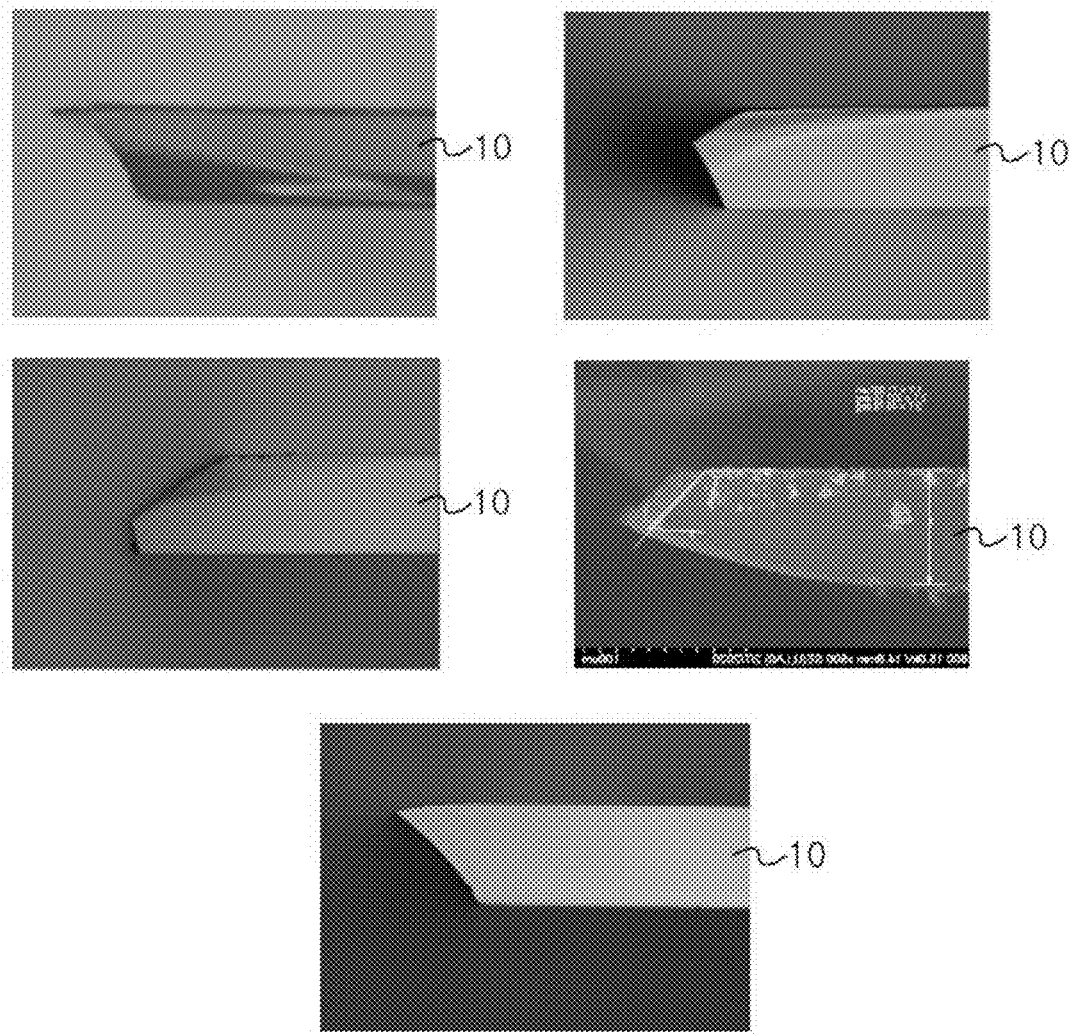
FIG. 22 is a cross-sectional photograph of a tapered surface formed on a sidewall of the glass substrate 10.
Figure 23:
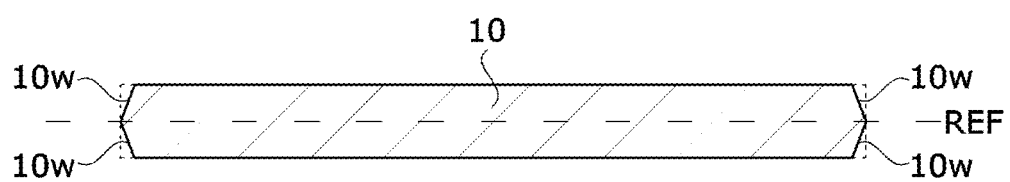
FIG. 23 is a view showing various examples of a wedge-type sidewall of a glass substrate according to an embodiment of the present disclosure.
Figure 23:
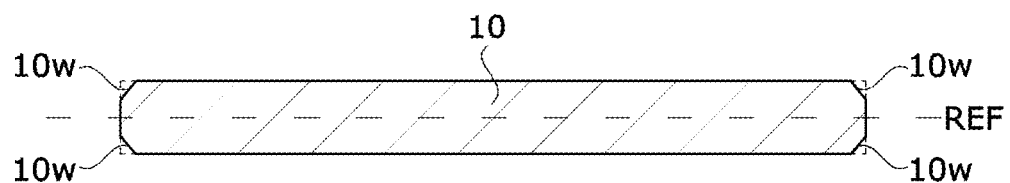
Figure 23:
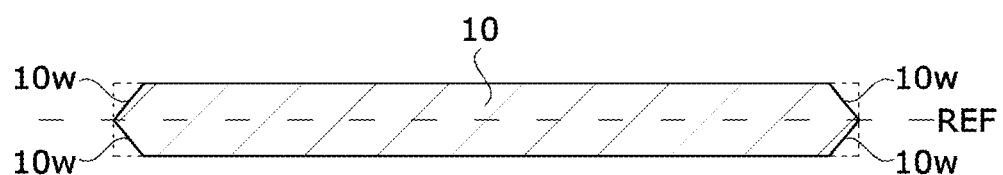
Figure 23:
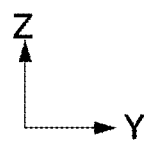
Figure 24:
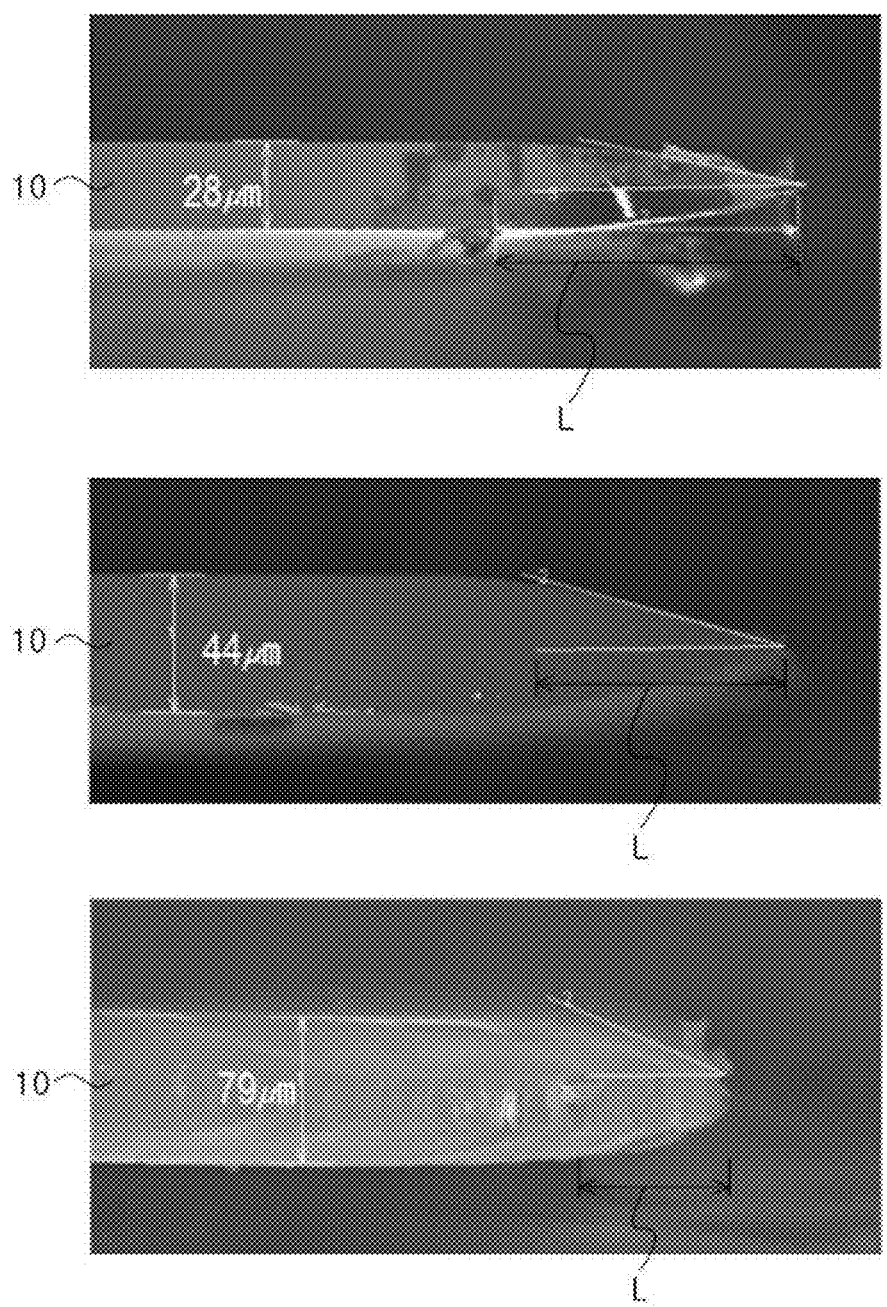
FIG. 24 is a cross-sectional photograph of a glass substrate showing a tapered surface when the thickness of the substrate is reduced by an etching process of the glass substrate.

FIG. 22 is a cross-sectional photograph of a tapered surface formed on a sidewall of the glass substrate 10. FIG. 23 is a view showing various examples of a wedge-type sidewall of the glass substrate 10. FIG. 24 is a cross-sectional photograph of the glass substrate showing a tapered surface when the thickness of the substrate is reduced by an etching process of the glass substrate 10.

Referring to FIG. 22, the sidewall of the glass substrate 10 can include a tapered surface. In other words, the thickness of the sidewall of the edge of the glass substrate 10 according to the embodiment can be smaller at the edge of the substrate than at the center of the substrate. For example, the thickness of the edge of the glass substrate 10 can be inversely proportional to the distance from the center. The shape of the sidewall of the edge of the substrate can be variously shown as in the embodiments shown in FIG. 22. The embodiments shown in FIG. 22 have upper and lower asymmetric tapered surfaces with respect to the thickness center of the glass substrate 10. The shape of the tapered surface is not limited thereto, and can be vertically symmetrical with respect to the center of the thickness of the glass substrate 10 as shown in FIGS. 23 and 24.

Referring to FIGS. 23 and 24, the wedge-type sidewall of the glass substrate 10 has a vertically symmetric tapered surface 10w with respect to center REF of the thickness of the glass substrate 10. As shown in the photograph of FIG. 24, as the thickness of the glass substrate 10 decreases, the length L of the tapered surface 10w can increase. In other words, the length L of the tapered surface 10w can be in inverse proportion to the thickness of the glass substrate 10.

Figure 25:
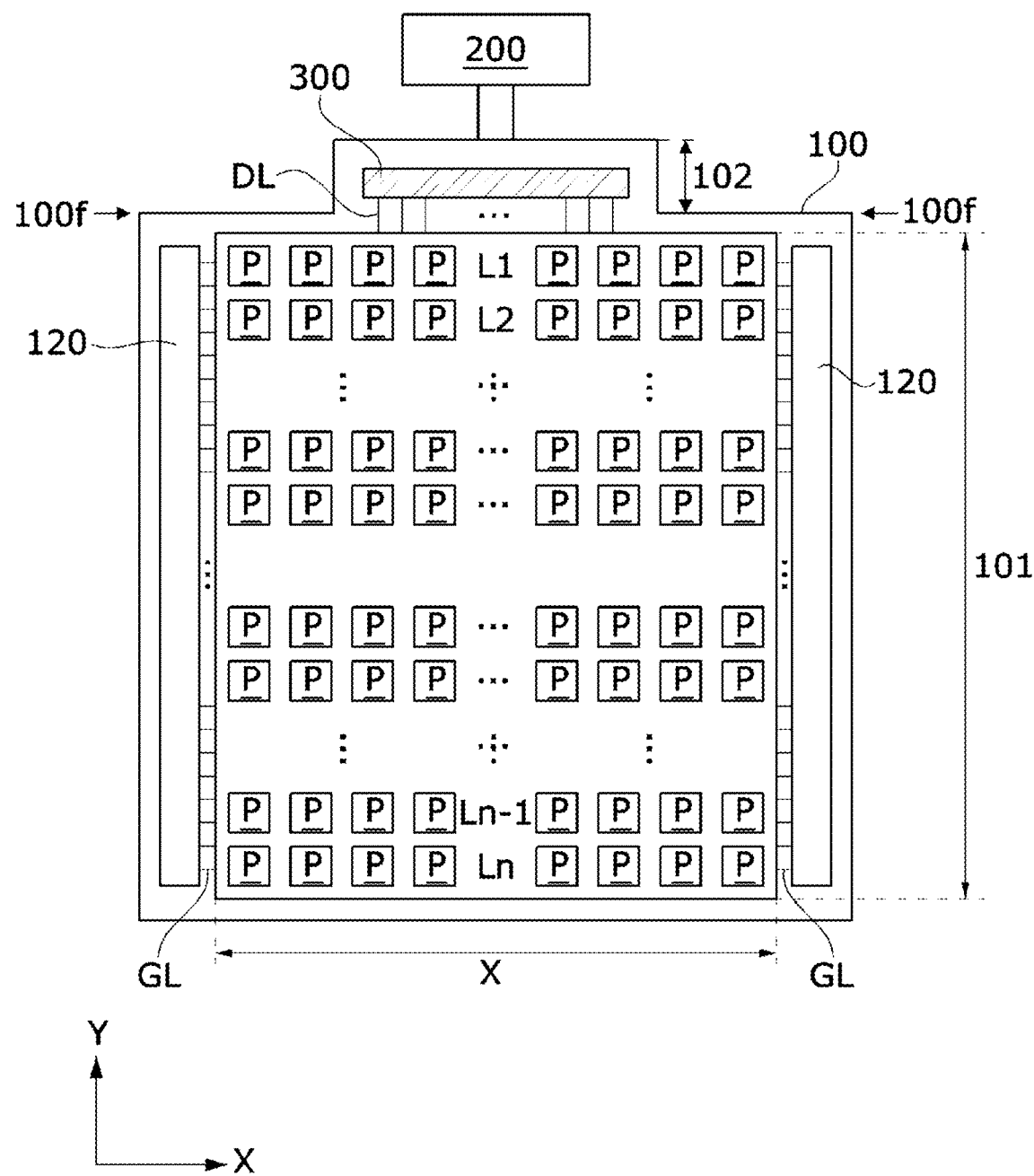
FIG. 25 is a block diagram illustrating an example of a display device according to an embodiment of the present disclosure.
Figure 26:
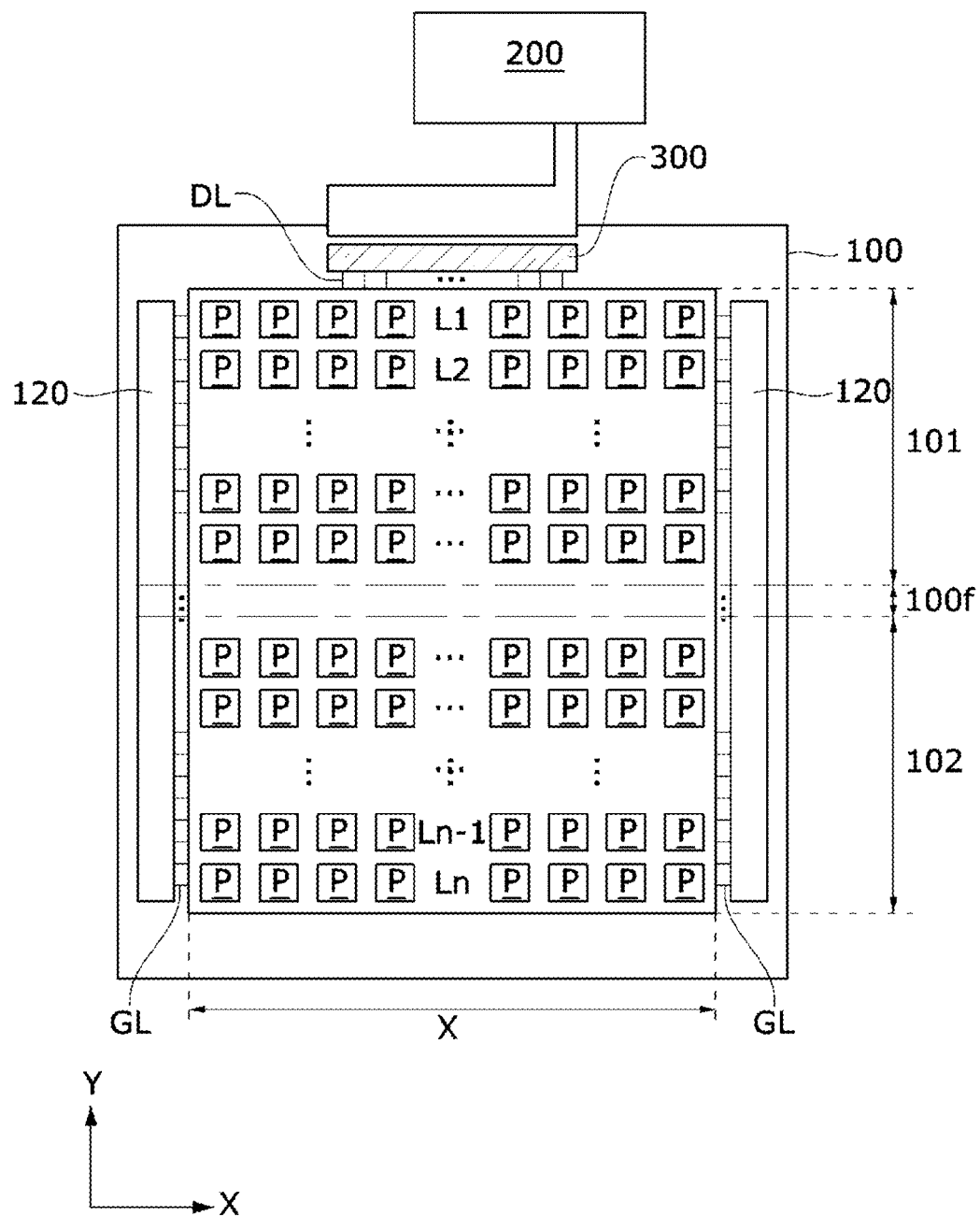
FIG. 26 is a block diagram illustrating an example of a display device according to another embodiment of the present disclosure.
Figure 27:
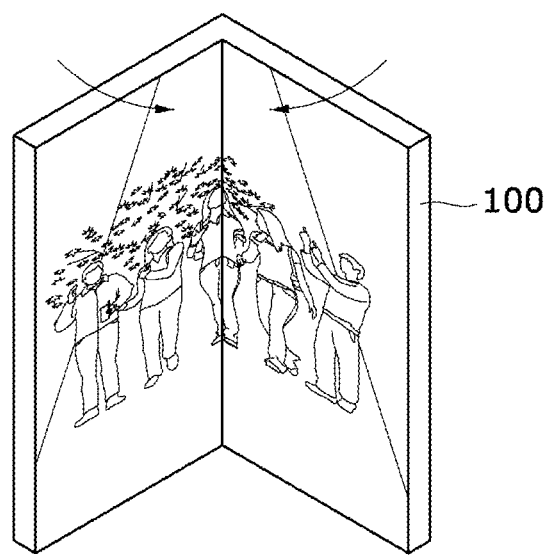
FIGS. 27A and 27B are views showing an example in which the display device illustrated in FIG. 26 is folded.
Figure 27:
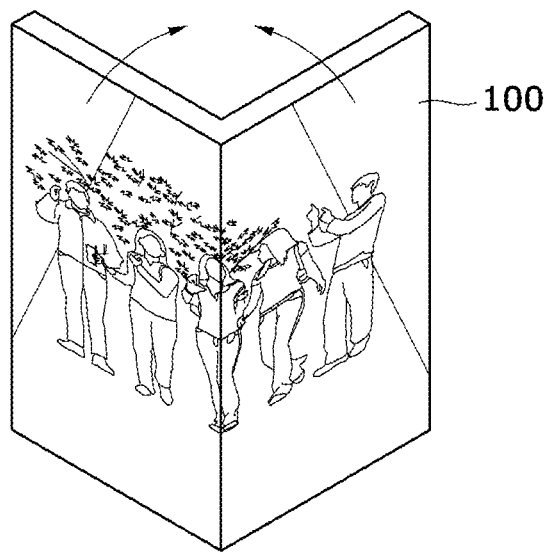
Figure 28:
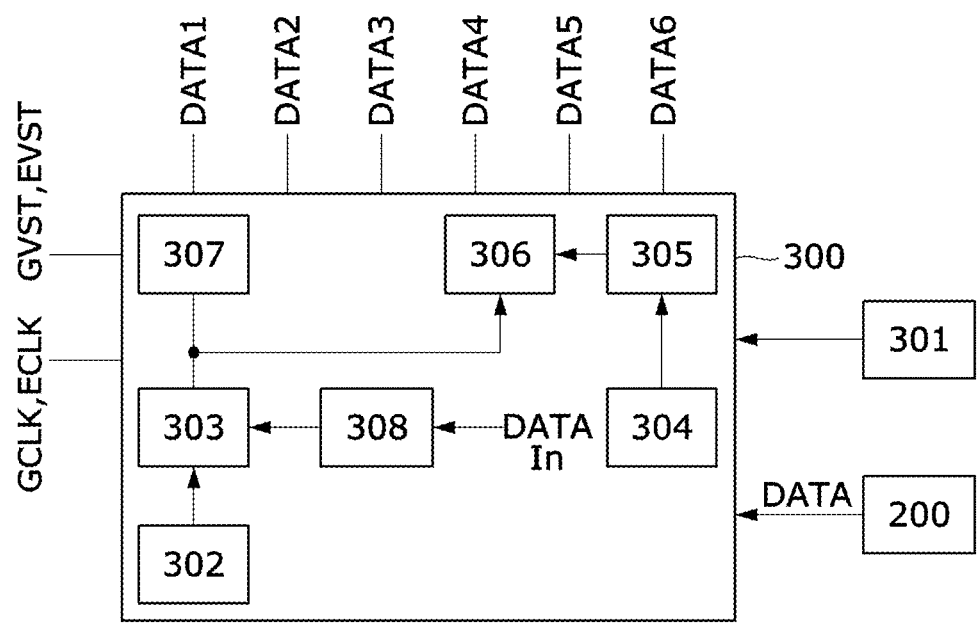
FIG. 28 is a block diagram schematically showing the configuration of a drive IC according to an example of the present disclosure.

FIG. 25 is a block diagram illustrating an example of a display device according to an embodiment of the present disclosure. FIG. 26 is a block diagram illustrating an example of a display device according to another embodiment of the present disclosure. FIGS. 27A and 27B are views showing an example in which the display device illustrated in FIG. 26 is folded. FIG. 28 is a block diagram schematically showing the configuration of a drive IC.

In the display device shown in FIG. 25, the display panel 100 can be folded around the bending portion 100f between first and second regions 101 and 102. The first region 101 includes a pixel array of a screen on which an image is reproduced. The second region 102 does not include a pixel array. The drive IC 300 can be mounted on the second region 102, and the second region 102 can be folded behind the first region 101.

In the display device shown in FIG. 26, the display panel 100 includes non-bending portions 101 and 102 that are folded around the bending portion 100f. In the display panel 100, the bending portion 100f and the non-bending portions 101 and 102 can include a pixel array in which an input image is reproduced. As shown in FIG. 25, in the display device, when the display panel 100 is unfolded, the entire screen of the display panel 100 can be activated to display an image on the maximum screen. When the display panel 100 is folded, a part of the screen can be activated to display an image on an active region smaller than the maximum screen, and a black color can be displayed on an inactive region or a previous image can be maintained.

Referring to FIGS. 25 to 28, the display device includes a display panel 100 in which a pixel array is disposed on a screen, and a display panel driver.

The pixel array of the display panel 100 includes pixels P arranged in a matrix form defined by data lines DL, gate lines GL intersected with the data lines DL, and data lines DL and gate lines GL. The structure of the display panel 100 includes a circuit layer and a light emitting element layer stacked on the glass substrate 10 as in the above-described embodiments. The light emitting element layer includes a light emitting element of the pixel circuit.

The display panel 100 illustrated in FIG. 26 can be folded in an in-folding method illustrated in FIG. 27A or an out-folding method illustrated in FIG. 27B. In the in-folding method, the screen on which the image is displayed is the inner surface that is folded in the display panel 100. Accordingly, when the display panel 100 is folded in the in-folding method, the screen is not exposed to the outside. In the out-folding method, the display panel 100 is the outer surface in the screen is exposed to the outside when the display panel 100 is folded as shown in FIG. 27B.

Each of the pixels P includes sub-pixels having different colors for color implementation. The sub-pixels include red (hereinafter referred to as "R sub-pixel"), green (hereinafter referred to as "G sub-pixel"), and blue (hereinafter referred to as "B sub-pixel"). Each of the pixels P can further include a white sub-pixel. Hereinafter, a pixel can be interpreted as a sub-pixel unless otherwise defined. Each of the sub-pixels can include a pixel circuit.

The pixel circuit can include a light emitting element, a driving element for supplying current to the light emitting element, a plurality of switch devices for programming a conduction condition of the driving device and switching current paths between the driving element and the light emitting element, and a capacitor for maintaining the gate voltage of the driving element, and the like.

The display panel driver writes the pixel data of the input image to the pixels P. The display panel driver includes a data driver 306 for supplying a data voltage of pixel data to the data lines DL, and a gate driver 120 for sequentially supplying a gate pulse to the gate lines GL. The data driver 306 can be integrated in the drive IC 300.

The drive IC 300 can be attached to the display panel 100. The drive IC 300 receives pixel data of an input image and a timing signal from the host system 200, supplies a data voltage of the pixel data to the pixels, and synchronizes the data driver 306 and the gate driver 120.

The drive IC 300 is connected to the data lines DL1 to DL6 through data output channels to supply a voltage of a data signal to the data lines. The drive IC 300 can output a gate-timing signal for controlling the gate driver 120 through gate timing signal output channels. The gate timing signal generated from the timing controller 303 can include a Gate start pulse (VST), a Gate shift clock (CLK), and the like. The start pulse VST and the shift clock CLK swing between the gate-on voltage VGL and the gate-off voltage VGH. The gate timing signals VST and CLK output from the level shifter 307 are applied to the gate driver 120 to control a shift operation of the gate driver 120.

The gate driver 120 can include a shift register formed in the circuit layer of the display panel 100 together with the pixel array. The shift register of the gate driver 120 sequentially supplies the gate signal to the gate lines GL under the control of the timing controller. The gate signal can include a scan pulse and an EM pulse of the light emitting signal. The shift register can include a scan driver for outputting a scan pulse and an EM driver for outputting an EM pulse. In FIG. 27, GVST and GCLK are gate-timing signals input to the scan driver. EVST and ECLK are gate-timing signals input to the EM driver.

The drive IC 300 can be connected to the host system 200, a first memory 301, and the display panel 100. The drive IC 300 can include a data reception and operation unit 308, a timing controller 303, a data driver 306, a gamma compensation voltage generator 305, a power supply unit 304, a second memory 302, and the like.

The data reception and operation unit 308 includes a receiver for receiving pixel data input as a digital signal from the host system 200 and a data operation unit for improving image quality by processing the pixel data input through the receiver. The data operation unit can include a data restoration unit that decodes and restores compressed pixel data, an optical compensation unit that adds a preset optical compensation value to the pixel data, and the like. The optical compensation value can be set as a value for correcting the luminance of each pixel data based on the luminance of the screen measured based on the camera image captured in the manufacturing process.

The timing controller 303 provides pixel data of an input image received from the host system 200 to the data driver 306. The timing controller 303 generates a gate-timing signal for controlling the gate driver 120 and a source-timing signal for controlling the data driver 306 to control the operation timing of the gate driver 120 and the data driver 306.

The data driver 306 converts the pixel data (digital signal) received from the timing controller 303 through a digital-to-analog converter (hereinafter referred to as "DAC") into a gamma compensation voltage to output a data signal DATA1 to DATA6 (hereinafter referred to as "data voltage"). The data voltage output from the data driver 306 is supplied to the data lines DL1 to DL6 of the pixel array through an output buffer (Source AMP) connected to the data channel of the drive IC 300.

The gamma compensation voltage generator 305 divides a gamma reference voltage from the power supply unit 304 through a voltage divider circuit to generate a gamma compensation voltage for each gray level. The gamma compensation voltage is an analog voltage in which a voltage is set for each gray level of pixel data. The gamma compensation voltage output from the gamma compensation voltage generator 305 is provided to the data driver 306.

The power supply unit 304 generates power required for driving the pixel array of the display panel 100, the gate driver 120, and the drive IC 300 using a DC-DC converter. The DC-DC converter can include a charge pump, a regulator, a buck converter, a boost converter, and the like. The power supply unit 304 can adjust the DC input voltage from the host system 200 to generate DC power such as a gamma reference voltage, a gate-on voltage VGL, a gate-off voltage VGH, a pixel driving voltage ELVDD, a low potential power voltage ELVSS, an initialization voltage Vini, and the like. The gamma reference voltage is supplied to a gamma compensation voltage generator 305. The gate-on voltage VGL and the gate-off voltage VGH are supplied to a level shifter 307 and the gate driver 120. The pixel power such as the pixel driving voltage ELVDD, the low potential power voltage ELVSS, and the initialization voltage Vini, and the like is commonly supplied to the pixels P. The initialization voltage Vini is set to a DC voltage lower than the pixel driving voltage ELVDD and lower than the threshold voltage of the light emitting element OLED to suppress light emission of the light emitting element OLED.

The second memory 302 stores a compensation value, register setting data, and the like, received from the first memory 301 when the power is input to the drive IC 300. The compensation value can be applied to various algorithms that have improved image quality. The compensation value can include an optical compensation value. The register setting data defines operations of the data driver 306, the timing controller 303, the gamma compensation voltage generator 305, and the like. The first memory 301 can include a flash memory. The second memory 302 can include static RAM (SRAM).

The host system 200 can be implemented as an application processor (AP). The host system 200 can transmit pixel data of an input image to the drive IC 300 through a mobile Industry Processor Interface (MIPI). The host system 200 can be connected to the drive IC 300 through a flexible printed circuit (FPC), for example.

The host system 200 can detect the folding and unfolding states of the display panel 100 shown in FIG. 25 and sense a folding angle using a sensor.

In the display device of the present disclosure, the pixel circuit and the gate driver can include a plurality of transistors. The transistors can be implemented as an oxide thin film transistor (TFT) including an oxide semiconductor, an LTPS TFT including a low temperature poly silicon (LTPS), and the like. Each of the transistors can be implemented as a p-channel TFT or an n-channel TFT. In the embodiment, the description will be focused on an example in which the transistors of the pixel circuit are implemented as a p-channel TFT, but the present disclosure is not limited thereto.

A transistor is a three-electrode device including a gate, a source, and a drain. The source is an electrode that supplies carriers to the transistor. In the transistor, the carriers begin to flow from the source. The drain is an electrode through which carriers exit the transistor. In a transistor, the flow of carriers flows from the source to the drain. In the case of an n-channel transistor, the source voltage is lower than the drain voltage so that electrons can flow from the source to the drain because the carriers are electrons. In an re-channel transistor, current flows from the drain to the source. In the case of a p-channel transistor (PMOS), since carriers are holes, the source voltage is higher than the drain voltage so that holes can flow from the source to the drain. In a p-channel transistor, current flows from the source to the drain because holes flow from the source to the drain. It should be noted that the source and drain of the transistor are not fixed. For example, the source and drain can be changed according to an applied voltage. Accordingly, the present disclosure is not limited by the source and drain of the transistor. In the following description, the source and drain of the transistor will be referred to as first and second electrodes.

The gate pulse swings between a gate-on voltage and a gate-off voltage. The gate-on voltage is set to a voltage higher than the threshold voltage of the transistor, and the gate-off voltage is set to a voltage lower than the threshold voltage of the transistor. The transistor is turned on in response to the gate-on voltage, while it is turned off in response to the gate-off voltage. In the case of an n-channel transistor, the gate-on voltage can be a gate high voltage (VGH), and the gate-off voltage can be a gate low voltage (VGL). In the case of the p-channel transistor, the gate-on voltage can be the gate low voltage VGL, and the gate-off voltage can be the gate high voltage VGH.

The driving element in each of the pixels can be implemented as a transistor. Although the driving element should have uniform electrical characteristics among all pixels, there can be differences between pixels due to process deviation and element characteristics deviation and can change with the lapse of display driving time. In order to compensate for the deviation in the electrical characteristics of the driving element, the display device can include an internal compensation circuit and an external compensation circuit. The internal compensation circuit is added to the pixel circuit in each of the sub-pixels to sample the threshold voltage Vth and/or mobility μ of the driving element, which change according to the electrical characteristics of the driving element, and compensate for the change in real time. The external compensation circuit transmits a threshold voltage and/or mobility of a driving element sensed through a sensing line connected to each of the sub-pixels to an external compensation unit. The compensation unit of the external compensation circuit compensates for the change in the electrical characteristics of the driving element by modulating the pixel data of the input image by reflecting the sensing result. By sensing a voltage of a pixel that changes according to an electrical characteristic of an external compensation-driving element, and modulating data of an input image in an external circuit based on the sensed voltage, the deviation in the electrical characteristic of the driving element between pixels is compensated.

Figure 29:
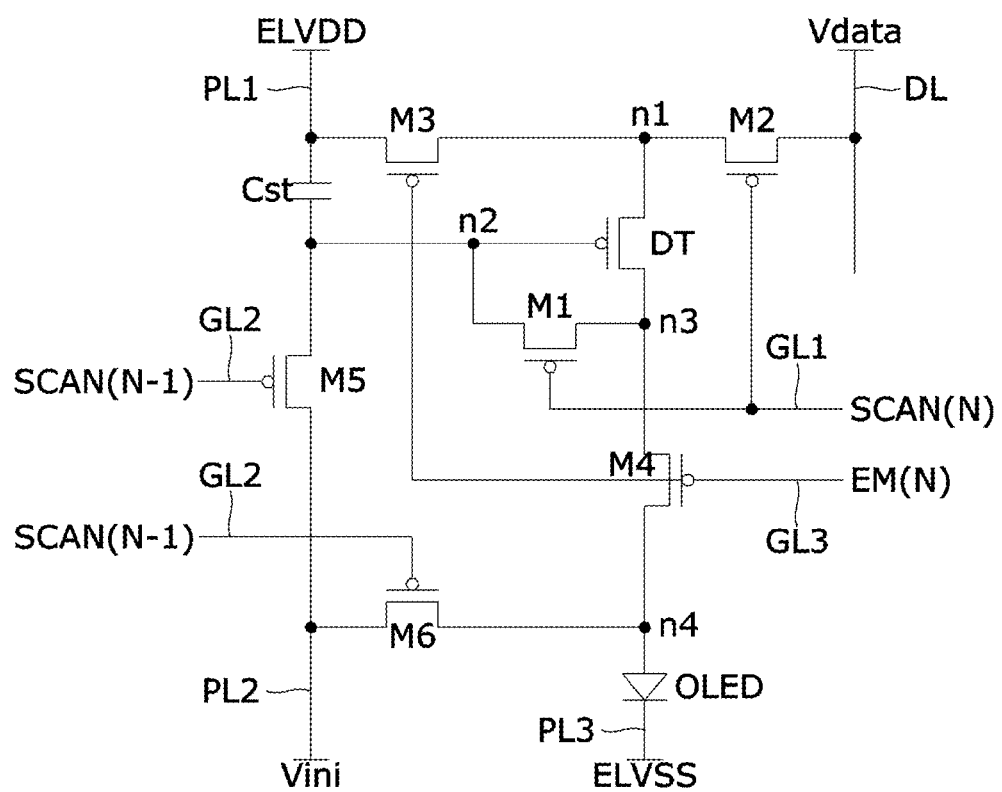
FIG. 29 is a circuit diagram showing an example of a pixel circuit according to an example of the present disclosure.
Figure 30:
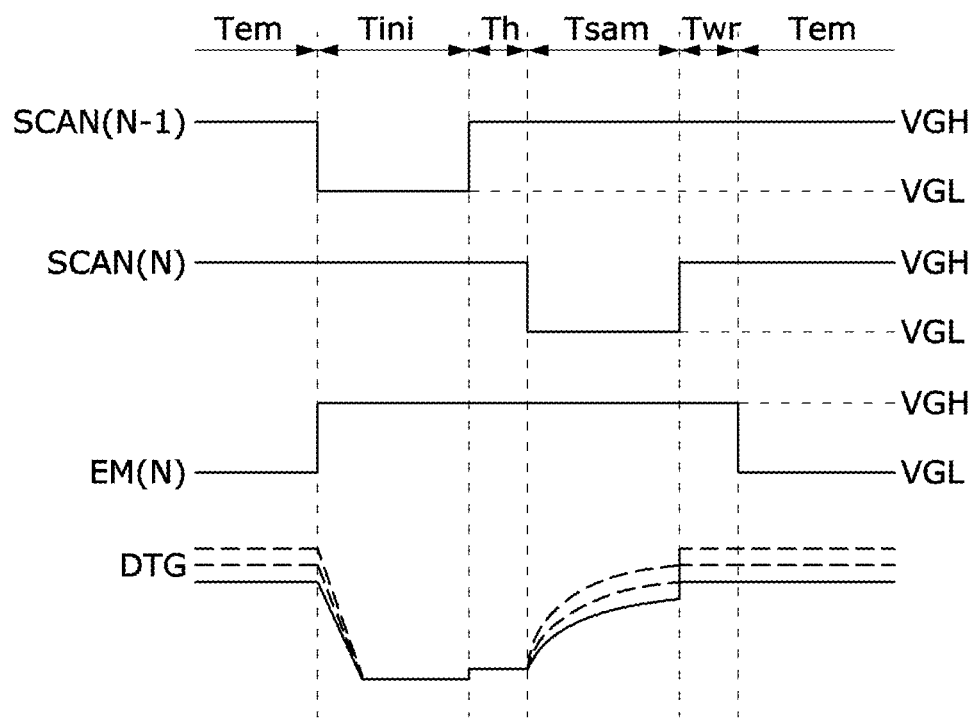
FIG. 30 is a diagram illustrating a method of driving the pixel circuit shown in FIG. 29.

FIG. 29 is a circuit diagram showing an example of a pixel circuit. FIG. 30 is a diagram illustrating a method of driving the pixel circuit shown in FIG. 29. The pixel circuit applicable to the present disclosure is not limited to FIGS. 29 and 30.

Referring to FIGS. 29 and 30, the pixel circuit includes a light emitting element OLED, a driving element DT for supplying current to the light emitting element OLED, and an internal compensation circuit for compensating for the gate voltage of the driving element DT by the threshold voltage Vth of the driving element DT, by using a plurality of switch elements M1 to M6 and sampling the threshold voltage Vth of the driving element DT. Each of the driving element DT and the switch elements M1 to M6 can be implemented as a p-channel TFT.

The driving period of the pixel circuit using the internal compensation circuit can be divided into an initialization period Tini, a sampling period Tsam, a data-writing period Twr, and a light emitting period Tem.

During the initialization period Tini, the N−1-th scan signal SCAN(N−1) is generated as a pulse of the gate-on voltage VGL, and a voltage of each of the N-th scan signal SCAN(N) and the light emitting signal EM(N) is the gate-off voltage VGH. During the sampling period Tsam, the N-th scan signal SCAN(N) is generated as a pulse of the gate-on voltage VGL, and a voltage of each of the N-lth scan signal SCAN(N-1) and the light emitting signal EM(N) is the gate-off voltage VGH. During the data-writing period Twr, a voltage of each of the N-lth scan signal SCAN(N-1), the Nth scan signal SCAN(N), and the light emitting signal EM(N) is the gate-off voltage VGH. During at least a part of the light emitting period Tem, the light emitting signal EM(N) is generated as the gate-on voltage VGL, and a voltage of each of the N-1 scan signal SCAN(N-1) and the N-th scan signal SCAN(N) is generated as the gate-off voltage VGH.

During the initialization period Tin, the fifth and sixth switch elements M5 and M6 are turned on according to the gate-on voltage VGL of the N-lth scan signal SCAN(N-1) to initialize the pixel circuit. During the sampling period Tsam, the first and second switch elements M1 and M2 are turned on according to the gate-on voltage VGL of the N-th scan signal SCAN(N), such that the threshold voltage of the driving element DT is sampled and stored in the capacitor Cst. During the data-writing period Twr, the first to sixth switch elements M1 to M6 maintain an off state. During the light emitting period Tem, the third and fourth switch elements M3 and M4 are turned on to emit light from the light emitting element OLED. During the light emitting period Tem, in order to precisely express the luminance of the low gray level with the duty ratio of the light emitting signal EM(N), the light emitting signal EM(N) swings at a predetermined duty ratio between the gate-on voltage VGL and the gate-off voltage VGH, so that the third and fourth switch elements M3 and M4 are turned on/off repeatedly.

The light emitting element OLED can be implemented as an organic light emitting diode or as an inorganic light emitting diode. Hereinafter, an example in which the light emitting element OLED is implemented as an organic light emitting diode will be described.

The light emitting element OLED can include an organic compound layer formed between an anode and a cathode. The organic compound layer includes a hole injection layer (HIL), a hole transport layer (HTL), an emission layer (EML), an electron transport layer (ETL) and an electron injection layer (EIL), but is not limited thereto. When a voltage is applied to the anode and cathode of the OLED, holes passing through the hole transport layer (HTL) and electrons passing through the electron transport layer (ETL) are moved to the emission layer (EML), such that excitons are formed, and visible light is emitted from the emission layer (EML).

The anode of the light emitting element OLED is connected to the fourth node n4 between the fourth and sixth switch elements M4 and M6. The fourth node n4 is connected to the anode of the light emitting element OLED, the second electrode of the fourth switch element M4, and the second electrode of the sixth switch element M6. The cathode of the light emitting element OLED is connected to a VSS electrode PL3 to which the low potential power voltage VSS is applied. The light emitting element OLED emits light with a current Ids flowing according to the gate-source voltage Vgs of the driving element DT. The current path of the light emitting element OLED is switched by the third and fourth switch elements M3 and M4.

The storage capacitor Cst is connected between the VDD line PL1 and the first node n1. The data voltage Vdata compensated by the threshold voltage Vth of the driving element DT is charged in the storage capacitor Cst. Since the data voltage Vdata in each of the sub-pixels is compensated by the threshold voltage Vth of the driving element DT, the characteristic deviation of the driving element DT in the sub-pixels is compensated.

The first switch element M1 is turned on in response to the gate-on voltage VGL of the N-th scan pulse SCAN(N) to connect the second node n2 and the third node n3. The second node n2 is connected to the gate of the driving element DT, the first electrode of the storage capacitor Cst, and the first electrode of the first switch element M1. The third node n3 is connected to the second electrode of the driving element DT, the second electrode of the first switch element M1, and the first electrode of the fourth switch element M4. A gate of the first switch element M1 is connected to the first gate line GL1 to receive the N-th scan pulse SCAN(N). A first electrode of the first switch element M1 is connected to the second node n2, and a second electrode of the first switch element M1 is connected to the third node n3.

The second switch element M2 is turned on in response to the gate-on voltage VGL of the N-th scan pulse SCAN(N) to supply the data voltage Vdata to the first node n1. A gate of the second switch element M2 is connected to the first gate line GL1 to receive the N-th scan pulse SCAN(N). A first electrode of the second switch element M2 is connected to the first node n1. A second electrode of the second switch element M2 is connected to the data line DL to which the data voltage Vdata is applied. The first node n1 is connected to the first electrode of the second switch element M2, the second electrode of the third switch element M3, and the first electrode of the driving element DT.

The third switch element M3 is turned on in response to the gate-on voltage VGL of the light emitting signal EM(N) to connect the VDD line PL1 to the first node n1. A gate of the third switch element M3 is connected to the third gate line GL3 to receive the light emitting signal EM(N). A first electrode of the third switch element M3 is connected to the VDD line PL1. A second electrode of the third switch element M3 is connected to the first node n1.

The fourth switch element M4 is turned on in response to the gate-on voltage VGL of the light emitting signal EM(N) to connect the third node n3 to the anode of the light emitting element OLED. A gate of the fourth switch element M4 is connected to the third gate line GL3 to receive the light emitting signal EM(N). A first electrode of the fourth switch element M4 is connected to the third node n3, and a second electrode of the fourth switch element M4 is connected to the fourth node n4.

The fifth switch element M5 is turned on in response to the gate-on voltage VGL of the N-1-th scan pulse SCAN (N-1) to connect the second node n2 to the Vini line PL2. The gate of the fifth switch element M5 is connected to the second gate line GL2 to receive the N-lth scan pulse SCAN(N-1). A first electrode of the fifth switch element M5 is connected to the second node n2, and a second electrode of the fifth switch element M5 is connected to the Vini line PL2.

The sixth switch element M6 is turned on in response to the gate-on voltage VGL of the N-1-th scan pulse SCAN (N-1) to connect the Vini line PL2 to the fourth node n4. The gate of the sixth switch element M6 is connected to the second gate line GL2 to receive the N-lth scan pulse SCAN(N-1). A first electrode of the sixth switch element M6 is connected to the Vini line PL2, and a second electrode of the sixth switch element M6 is connected to the fourth node n4.

The driving element DT controls the current Ids flowing through the light emitting element OLED according to the gate-source voltage Vgs to drive the light emitting element OLED. The driving element DT includes a gate connected to the second node n2, a first electrode connected to the first node n1, and a second electrode connected to the third node n3.

During the initialization period Tini, the N-lth scan pulse SCAN(N−1) is generated as the gate-on voltage VGL. The N-th scan pulse SCAN(N) and the light emitting signal EM(N) maintain the gate-off voltage VGH during the initialization period Tini. Accordingly, during the initialization period Tini, the fifth and sixth switch elements M5 and M6 are turned on, so that the second and fourth nodes n2 and n4 are initialized to Vini. A hold period Th can be set between the initialization period Tini and the sampling period Tsam. In the hold period Th, the gate pulses SCAN(N−1), SCAN(N), and EM(N) maintain the previous state.

During the sampling period Tsam, the N-th scan pulse SCAN(N) is generated as the gate-on voltage VGL. The pulse of the Nth scan pulse SCAN(N) is synchronized with the data voltage Vdata of the Nth pixel line. The N-lth scan pulse SCAN(N−1) and the light emitting signal EM(N) maintain the gate-off voltage VGH during the sampling period Tsam. Accordingly, the first and second switch elements M1 and M2 are turned on during the sampling period Tsam.

During the sampling period Tsam, the gate voltage DTG of the driving element DT is increased by the current flowing through the first and second switch elements M1 and M2. Since the driving element DT is turned off when the driving element DT is turned off, the gate node voltage DTG is Vdata−|Vth|. In this case, the voltage of the first node n is also Vdata−|Vth|. In the sampling period Tsam, the gate-source voltage Vgs of the driving element DT is |Vgs|=Vdata−(Vdata−|Vth|)=|Vth|.

During the data-writing period Twr, the N-th scan pulse SCAN(N) is inverted to the gate-off voltage VGH. The N-lth scan pulse SCAN(N−1) and the light emitting signal EM(N) maintain the gate-off voltage VGH during the data writing period Twr. Accordingly, all the switch elements M1 to M6 maintain an off state during the data writing period Twr.

During the light emitting period Tem, the light emitting signal EM(N) can be generated as a gate-off voltage VGH. During the light emitting period Tem, in order to improve expression power of a low gray level, the light emitting signal EM(N) can be turned on/off with a predetermined duty ratio to be swung between the gate-on voltage VGL and the gate-off voltage VGH. Accordingly, the light emitting signal EM(N) can be generated as the gate-on voltage VGL during at least a part of the light emitting period Tem.

When the light emitting signal EM(N) is the gate-on voltage VGL, current flows between the ELVDD and the light emitting element OLED, so that the light emitting element OLED can emit light. During the light emitting period Tem, the N−1-th and N-th scan pulses SCAN(N−1) and SCAN(N) maintain the gate-off voltage VGH. During the light emitting period Tem, the third and fourth switch elements M3 and M4 are repeatedly turned on/off according to the voltage of the light emitting signal EM. When the light emitting signal EM(N) is the gate-on voltage VGL, the third and fourth switch elements M3 and M4 are turned on, so that current flows through the light emitting element OLED. In this case, Vgs of the driving element DT is |Vgs|=ELVDD−(Vdata−|Vth|), and the current flowing through the light emitting element OLED is K(ELVDD−Vdata)2. K is a constant value determined by the charge mobility, parasitic capacitance, and channel capacitance of the driving element (DT).

Figure 31:
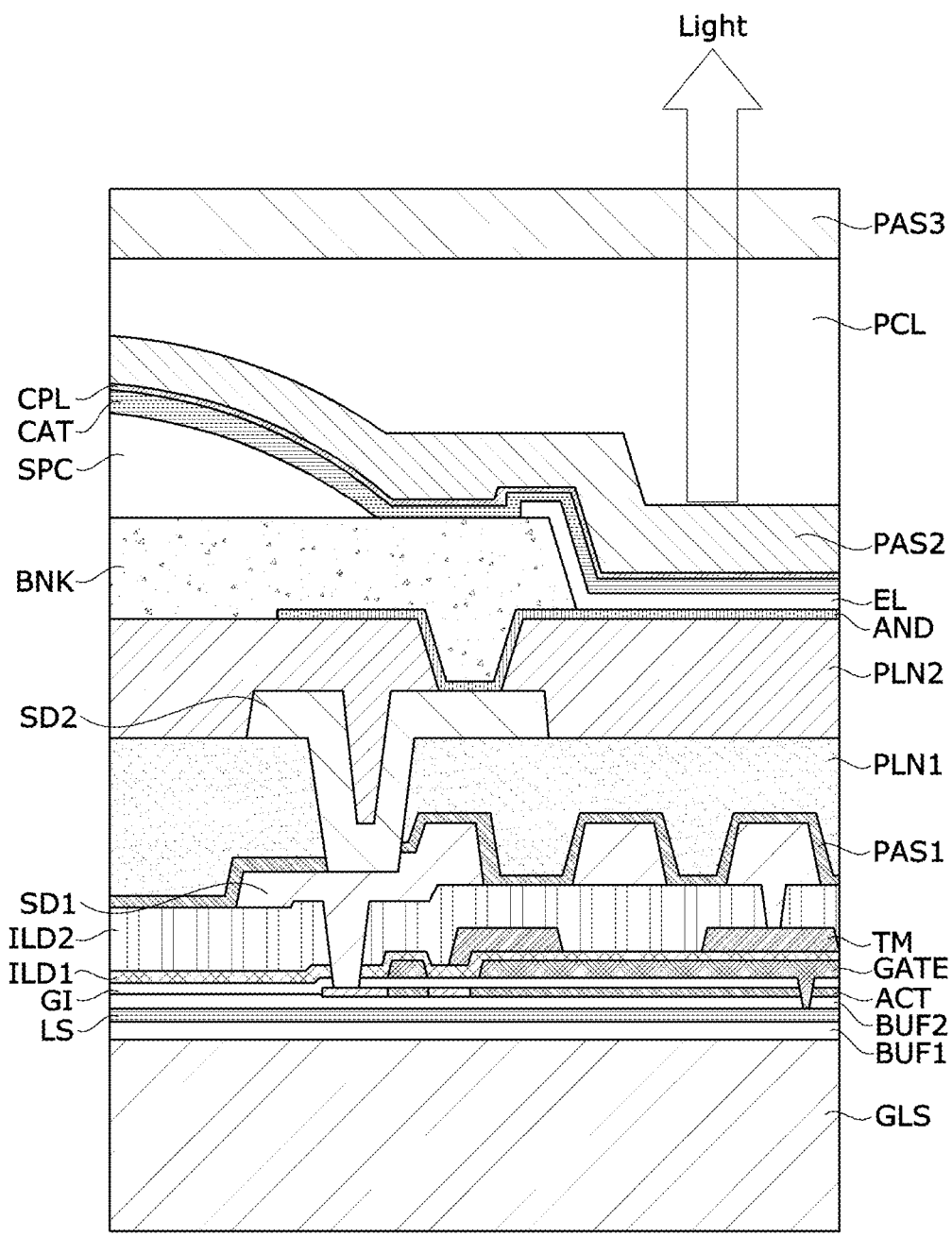
FIG. 31 is a cross-sectional view showing in detail a cross-section of a display panel according to an embodiment of the present disclosure.

FIG. 31 is a cross-sectional view showing in detail a cross-section of a display panel 100 according to an embodiment of the present disclosure. It should be noted that the cross-sectional structure of the display panel 100 shown in FIG. 31 is only an example, and the present disclosure is not limited thereto.

Referring to FIG. 31, a circuit layer, a light emitting element layer, an encapsulation layer, and the like can be stacked on the glass substrate GLS as described above.

A first buffer layer BUF1 can be formed on the glass substrate GLS. A first metal layer LC can be formed on the first buffer layer BUF1, and a second buffer layer BUF2 can be formed on the first metal layer LS. Each of the first and second buffer layers BUF1 and BUF2 can be formed of an inorganic insulating material and can be made of one or more insulating layers. The first metal layer LS can include a metal pattern disposed under the TFT to block light irradiated to the semiconductor channel layer of the TFT.

An active layer ACT can be formed on the first buffer layer BUF2. The active layer ACT includes semiconductor patterns of TFTs of a pixel circuit and TFTs of a gate driver, respectively. When the TFT is implemented as an oxide TFT, the semiconductor pattern can include indium gallium zinc oxide (IGZO).

A gate-insulating layer GI can be formed on the active layer ACT. The gate insulating film GI is an insulating layer made of an inorganic insulating material. A second metal layer GATE can be formed on the second gate-insulating layer GI. The second metal layer GATE can include a gate electrode of the TFT and a gate line connected to the gate electrode.

A first interlayer insulating film ILD1 can cover the second metal layer GATE. A third metal layer TM can be formed on the first interlayer insulating film ILD2, and the second interlayer insulating film ILD2 can cover the third metal layer TM. The capacitor Cst of the pixel circuit can be formed in a portion where the second metal layer GATE, the first interlayer insulating film ILD1, and the third metal layer TM are overlapped. The first and second interlayer insulating films ILD1 and ILD2 can include an inorganic insulating material.

A fourth metal layer SD1 can be formed on the second interlayer insulating film 1LD2, and an inorganic insulating film PAS1 and a first planarization layer PLN1 can be stacked thereon. A fifth metal layer SD2 can be formed on the first planarization layer PLN2. A partial pattern of the fifth metal layer SD2 can be connected to the fourth metal layer SD1 through a contact hole penetrating the first planarization layer PLN1 and the inorganic insulating film PAS1. The first and second planarization layers PLN1 and PLN2 are made of an organic insulating material for flattening surfaces.

The fourth metal layer SD1 can include first and second electrodes of the TFT connected to the semiconductor pattern of the TFT through a contact hole penetrating the second interlayer insulating film 1LD2. The data line DL and the power lines PL1 and PL2 can be implemented by patterning the fourth metal layer SD1 or the fifth metal layer SD2.

An anode electrode AND of the light emitting element OLED can be formed on the second planarization layer PLN2. The anode electrode AND can be connected to an electrode of a TFT used as a switch element or a driving element through a contact hole passing through the second planarization layer PLN2. The anode electrode AND can be formed of a transparent or semi-transparent electrode material.

A pixel defining film BNK can cover the anode electrode AND of the light emitting element OLED. The pixel defining film BNK is formed in a pattern defining a light emitting region (or an opening region) through which light passes from each of the pixels to the outside. A spacer SPC can be formed on the pixel defining film BNK. The pixel defining film BNK and the spacer SPC can be integrated with the same organic insulating material. The spacer SPC secures a gap between the FMM and the anode AND so that a fine metal mask (FMM) does not come into contact with the anode AND during the deposition process of the organic compound EL.

An organic compound EL is formed in a light emitting region of each of the pixels defined by the pixel defining film BNK. A cathode electrode CAT of the light emitting element OLED is formed on the front surface of the display panel 100 to cover the pixel defining film BNK, the spacer SPC, and the organic compound EL. The cathode electrode CAT can be connected to the VSS electrode PL3 formed of any one of the lower metal layers. A capping layer CPL can cover the cathode electrode CAT. The capping layer CPL protects the cathode electrode CAT by blocking penetration of air and out-gassing of the organic insulating material applied on the capping layer CPL as the cathode electrode CAT is formed of the inorganic insulating material. The inorganic insulating layer PAS2 can cover the capping layer CPL, and a planarization layer PCL can be formed on the inorganic insulating layer PAS2. The planarization layer PCL can include an organic insulating material. An inorganic insulating layer PAS3 of the encapsulation layer can be formed on the planarization layer PCL.

The above-described embodiments of the present disclosure can be applied alone or in combination.

The above description of various embodiments does not specify essential features of claims, the scope of claims is not limited to matters described in the present disclosure.

While embodiments of the present disclosure have been described in detail above with reference to the accompanying drawings, the present disclosure is not necessarily limited to these embodiments, and various changes and modifications can be made without departing from the subject matter of the present disclosure. Accordingly, the embodiments disclosed herein are to be considered descriptive and not restrictive of the subject matter of the present disclosure, and the scope of the subject matter of the present disclosure is not limited by these embodiments. Therefore, the above-described embodiments should be understood to be exemplary and not limiting in any aspect. The scope of the present disclosure should be construed by the appended claims, and all subject matters within the scopes of their equivalents should be construed as being included in the scope of the present disclosure.

What is claimed is:

1. A mother substrate comprising:
    a glass substrate including a bending portion and a non-bending portion in a region defined by cutting lines adjacent to each other of a plurality of cutting lines;
    an organic film overlapping the plurality of cutting lines on the glass substrate; and
    a plurality of cells spaced apart from each other with each of the plurality of cutting lines therebetween on the glass substrate,
    wherein the glass substrate includes an opening configured to expose a portion of the organic film in the bending portion.

2. The mother substrate of claim 1, wherein the organic film overlaps the plurality of cells and the plurality of cutting lines.

3. The mother substrate of claim 2, wherein the glass substrate further includes at least one bending line disposed on each of the plurality of cells, and
    the organic film includes a first organic film disposed on the glass substrate to overlap a cutting line between neighbored cells of the plurality of cells, and a second organic film disposed on the glass substrate to overlap the at least one bending line.

4. The mother substrate of claim 1, wherein each of the plurality of cells comprises:
    a circuit layer disposed on the glass substrate to drive a pixel;
    a light emitting element layer including a first electrode on the circuit layer, a bank disposed on the first electrode to define a light emitting area, an organic compound layer on the first electrode in the light emitting area, and a second electrode on the organic compound layer;
    an encapsulation layer covering the light emitting element layer; and
    a polarizing plate disposed on the encapsulation layer, and
    the organic film is disposed between the glass substrate and the circuit layer, and the organic layer and the bank include a same material.

5. The mother substrate of claim 4, wherein the organic film and the polarizing plate are sequentially stacked on the glass substrate between adjacent cells to overlap the plurality of cutting lines.

6. The mother substrate of claim 3, wherein the first and second organic films include a polyimide film.

7. The mother substrate of claim 3, wherein the glass substrate includes:
    a first opening exposing the first organic layer at positions overlapping the plurality of cutting lines;
    a second openings exposing the second organic layer at positions overlapping the at least one bending line, and
    a coating layer is disposed on a rear surface of the glass substrate and at least a portion of the first and second openings.

8. A display panel comprising:
    a glass substrate including a bending portion and a non-bending portion;
    a circuit layer disposed on the glass substrate to drive a pixel;
    a light emitting element layer including a light emitting element which includes a first electrode on the circuit layer, an organic compound layer on the first electrode, and a second electrode on the organic compound layer;
    an encapsulation layer covering the circuit layer and the light emitting element layer;
    a polarizing plate on the encapsulation layer; and
    an organic film on the glass substrate,
    wherein the glass substrate includes an opening configured to expose a portion of the organic film in the bending portion.

9. The display panel of claim 8, further comprising a bank disposed on the first electrode to define a light emitting area,
    wherein the organic film and the bank include a same material.

10. The display panel of claim 8, further comprising at least one bending line for folding the display panel, wherein the organic film includes a first organic film on edges of the glass substrate, and a second organic film disposed on the glass substrate to overlap the at least one bending line.

11. The display panel of claim 10, wherein the glass substrate includes an opening exposing the second organic layer at a position overlapping the at least one bending line.

12. The display panel of claim 11, wherein a coating layer is disposed on a rear surface of the glass substrate and at least a portion of the opening.

13. The display panel of claim 8, wherein an edge sidewall of the glass substrate includes a wedge-shaped tapered surface, and a thickness of the sidewall becomes thinner as it goes to the end of the sidewall.

14. The display panel of claim 13, wherein the wedge-shaped tapered surface protrudes out of the circuit layer.

15. The display panel of claim 13, wherein a length of the wedge-shaped tapered surface is inversely proportional to a thickness of the glass substrate.

16. A method of manufacturing a display panel from a plurality of cells disposed on a mother glass substrate having an organic film, the method comprising:
    setting a cutting line between adjacent cells of the plurality of cells;
    forming a mask on one surface of the mother glass substrate to cover regions other than the cutting line;
    etching the mother glass substrate exposed through the mask to form a first opening in the mother glass substrate;
    removing the mask; and
    cutting the organic film by irradiating a laser to the organic film overlapping the cutting line to separate the plurality of cells.

17. The method of claim 16, wherein the setting the cutting line includes setting at least one bending line on which the display panel is folded in each of the plurality of cells, and
    the forming the mask includes:
    forming the mask so that the mask does not cover the at least one bending line; and
    etching the mother glass substrate exposed through the mask to form a second opening.

18. The method of claim 17, wherein the organic film includes:
    a first organic film disposed on the glass substrate to overlap a cutting line between neighbored cells of the plurality of cells; and
    a second organic film disposed on the mother glass substrate to overlap the at least one bending line.

19. The method of claim 16, further comprising:
    forming a coating layer on another surface of the mother glass substrate after removing the mask; and
    cutting the coating layer by irradiating the laser to the coating layer when the organic film is cut.

20. The method of claim 16, wherein the etching the mother glass substrate is implemented by a wet etching.

* * * * *